(12) United States Patent   (10) Patent No.: US 7,633,471 B2
Yamazaki et al.   (45) Date of Patent: Dec. 15, 2009

(54) LIGHT-EMITTING DEVICE AND ELECTRIC APPLIANCE

(75) Inventors: Shunpei Yamazaki, Tokyo (JP); Jun Koyama, Kanagawa (JP); Toru Takayama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 463 days.

(21) Appl. No.: 09/852,220

(22) Filed: May 9, 2001

(65) Prior Publication Data

US 2002/0044111 A1   Apr. 18, 2002

(30) Foreign Application Priority Data

May 12, 2000   (JP) ............... 2000-140043

(51) Int. Cl.
  *G09G 3/32* (2006.01)
(52) U.S. Cl. ........................................ 345/83
(58) Field of Classification Search ................. 345/83, 345/84, 92, 98, 100, 204, 76, 80, 82, 211; 438/488, 149, 159, 146, 147, 213; 257/57, 257/72, 350, 59; 315/169.3, 169.2; 349/143; 445/24, 25
See application file for complete search history.

(56) References Cited

U.S. PATENT DOCUMENTS

| | | | |
|---|---|---|---|
| 4,644,338 A * | 2/1987 | Aoki et al. | ..................... 345/92 |
| 5,323,042 A | 6/1994 | Matsumoto | |
| 5,574,475 A | 11/1996 | Callahan, Jr. et al. | |
| 5,576,858 A | 11/1996 | Ukai et al. | ..................... 359/59 |
| 5,604,358 A | 2/1997 | Kim | |
| 5,643,826 A | 7/1997 | Ohtani et al. | ................. 437/88 |
| 5,663,589 A * | 9/1997 | Saitoh et al. | ................ 257/401 |
| 5,670,792 A | 9/1997 | Utsugi | |

(Continued)

FOREIGN PATENT DOCUMENTS

EP   0895219   2/1999

(Continued)

OTHER PUBLICATIONS

U.S. Appl. No. 09/448,463 (pending) to Koyama et al, filed Nov. 24, 1999, including specification, claims, drawings and PTO filing receipt.

(Continued)

*Primary Examiner*—Richard Hjerpe
*Assistant Examiner*—Abbas Abdulselam
(74) *Attorney, Agent, or Firm*—Cook Alex Ltd.

(57) ABSTRACT

An inexpensive light emitting device capable of displaying a bright image and an electric appliance using the light emitting device. In the light emitting device having a pixel portion and a driver circuit formed on one insulating member, all of semiconductor elements for the pixel portion and the driver circuit are formed by n-channel semiconductor elements, thereby enabling the manufacturing process to be simplified. Each of light-emitting elements provided in the pixel portion emits light in such a direction that most of the light travels away from the insulating member, so that substantially the whole of the pixel-forming segment electrode (corresponding to a cathode of an EL element) is formed as an effective light-emitting area. Therefore, a low-priced light-emitting device capable of displaying a bright image can be obtained.

30 Claims, 16 Drawing Sheets

U.S. PATENT DOCUMENTS

| | | | |
|---|---|---|---|
| 5,701,167 A | 12/1997 | Yamazaki | |
| 5,703,617 A | 12/1997 | Callahan, Jr. et al. | |
| 5,714,769 A | 2/1998 | Kim | |
| 5,714,968 A | 2/1998 | Ikeda et al. | |
| 5,719,591 A | 2/1998 | Callahan, Jr. et al. | |
| 5,726,676 A | 3/1998 | Callahan, Jr. et al. | |
| 5,748,165 A | 5/1998 | Kubota et al. | 345/96 |
| 5,790,222 A | 8/1998 | Kim | |
| 5,889,291 A | 3/1999 | Koyama et al. | 257/59 |
| 5,920,083 A | 7/1999 | Bae | |
| 5,923,962 A | 7/1999 | Ohtani et al. | 438/150 |
| 5,952,699 A | 9/1999 | Yamazaki et al. | 257/404 |
| 5,956,011 A | 9/1999 | Koyama et al. | 345/98 |
| 5,959,598 A * | 9/1999 | McKnight | 345/90 |
| 5,990,555 A | 11/1999 | Ohori et al. | 257/750 |
| 5,990,998 A | 11/1999 | Park et al. | 349/139 |
| 6,028,472 A | 2/2000 | Nagumo | |
| 6,031,249 A | 2/2000 | Yamazaki et al. | 257/66 |
| 6,031,290 A | 2/2000 | Miyazaki et al. | 257/764 |
| 6,037,924 A | 3/2000 | Koyama et al. | 345/92 |
| 6,067,062 A | 5/2000 | Takasu et al. | 345/87 |
| 6,078,366 A | 6/2000 | Dohjo et al. | 349/43 |
| 6,084,461 A * | 7/2000 | Colbeth et al. | 327/432 |
| 6,107,983 A * | 8/2000 | Masuda et al. | 345/98 |
| 6,169,391 B1 * | 1/2001 | Lei | 323/266 |
| 6,191,408 B1 * | 2/2001 | Shinotsuka et al. | 250/208.1 |
| 6,207,969 B1 | 3/2001 | Yamazaki | 257/49 |
| 6,208,395 B1 | 3/2001 | Kanoh et al. | 349/113 |
| 6,225,966 B1 | 5/2001 | Ohtani et al. | 345/87 |
| 6,278,132 B1 | 8/2001 | Yamazaki et al. | 257/69 |
| 6,292,183 B1 | 9/2001 | Yamazaki et al. | 345/211 |
| 6,310,598 B1 | 10/2001 | Koyama et al. | 345/98 |
| 6,372,558 B1 * | 4/2002 | Yamanaka et al. | 438/149 |
| 6,441,399 B1 | 8/2002 | Koyama et al. | |
| 6,456,350 B1 | 9/2002 | Ashizawa et al. | 349/141 |
| 6,461,899 B1 | 10/2002 | Kitakado et al. | 438/149 |
| 6,465,806 B2 | 10/2002 | Kubota et al. | 257/72 |
| 6,469,455 B1 * | 10/2002 | Inoue | 315/291 |
| 6,489,222 B2 | 12/2002 | Yoshimoto | 438/486 |
| 6,498,596 B1 * | 12/2002 | Nakamura et al. | 345/98 |
| 6,507,332 B1 | 1/2003 | Kuwabara et al. | |
| 6,515,310 B2 | 2/2003 | Yamazaki et al. | 257/98 |
| 6,522,315 B2 | 2/2003 | Ozawa et al. | |
| 6,524,877 B1 | 2/2003 | Nakazawa et al. | 438/48 |
| 6,525,719 B2 | 2/2003 | Yamazaki et al. | 345/211 |
| 6,580,475 B2 | 6/2003 | Yamazaki et al. | |
| 6,599,791 B1 | 7/2003 | Koyama et al. | |
| 6,608,613 B2 | 8/2003 | Koyama et al. | 345/98 |
| 6,670,225 B2 * | 12/2003 | Ohnuma | 438/166 |
| 6,670,599 B2 * | 12/2003 | Wagner et al. | 250/214.1 |
| 6,677,221 B2 * | 1/2004 | Kawasaki et al. | 438/486 |
| 6,690,033 B2 | 2/2004 | Yamazaki et al. | 257/72 |
| 6,703,671 B1 | 3/2004 | Yamazaki et al. | 257/404 |
| 6,713,748 B1 * | 3/2004 | Tsutsumi et al. | 250/208.1 |
| 6,747,627 B1 | 6/2004 | Koyama et al. | |
| 6,825,488 B2 | 11/2004 | Yamazaki et al. | |
| 6,858,878 B2 | 2/2005 | Yamazaki et al. | 257/98 |
| 6,943,764 B1 | 9/2005 | Koyama et al. | |
| 7,084,019 B2 | 8/2006 | Yamazaki et al. | |
| 7,166,862 B2 | 1/2007 | Koyama et al. | |
| 2001/0017372 A1 | 8/2001 | Koyama | 257/72 |
| 2001/0025959 A1 | 10/2001 | Yamazaki et al. | 257/72 |
| 2001/0030322 A1 | 10/2001 | Yamazaki et al. | 257/59 |
| 2001/0048115 A1 | 12/2001 | Yamazaki et al. | 257/154 |
| 2002/0024493 A1 | 2/2002 | Ozawa et al. | |
| 2002/0110941 A1 | 8/2002 | Yamazaki et al. | 438/25 |
| 2002/0158288 A1 | 10/2002 | Yamazaki et al. | 257/343 |
| 2003/0214006 A1 | 11/2003 | Nakamura et al. | 257/448 |
| 2005/0001541 A1 | 1/2005 | Yamazaki et al. | 313/503 |
| 2005/0259060 A1 | 11/2005 | Koyama et al. | |
| 2006/0273317 A1 | 12/2006 | Yamazaki et al. | |

FOREIGN PATENT DOCUMENTS

| | | |
|---|---|---|
| EP | 1 128 430 A2 | 8/2001 |
| JP | 01-101519 | 4/1989 |
| JP | 06-148685 | 5/1994 |
| JP | 06-281957 | 10/1994 |
| JP | 07-235680 | 9/1995 |
| JP | 08-274336 | 10/1996 |
| JP | 09-505904 | 6/1997 |
| JP | 10-048640 | 2/1998 |
| JP | 2001-313397 | 11/2001 |
| WO | WO-95/11506 | 4/1995 |

OTHER PUBLICATIONS

U.S. Appl. No. 09/448,756 (pending) to Koyama et al, filed Nov. 24, 1999, including specification, claims, drawings and PTO filing receipt.

U.S. Appl. No. 09/791,182 (pending) to Koyama, filed Feb. 23, 2001, including specification, claims and drawings.

U.S. Appl. No. 09/832,844 (pending) to Yamazaki including PTO filing receipt, specification, claims, abstract, and drawings.

Korean Office Action, Application No. 10-2001-0010388, dated May 10, 2007 (English translation).

1) U.S. Appl. No. 09/832,844 (pending) to Yamazaki including PTO filing receipt, specification, claims, abstract, and drawings, filed Apr. 12, 2001.

* cited by examiner

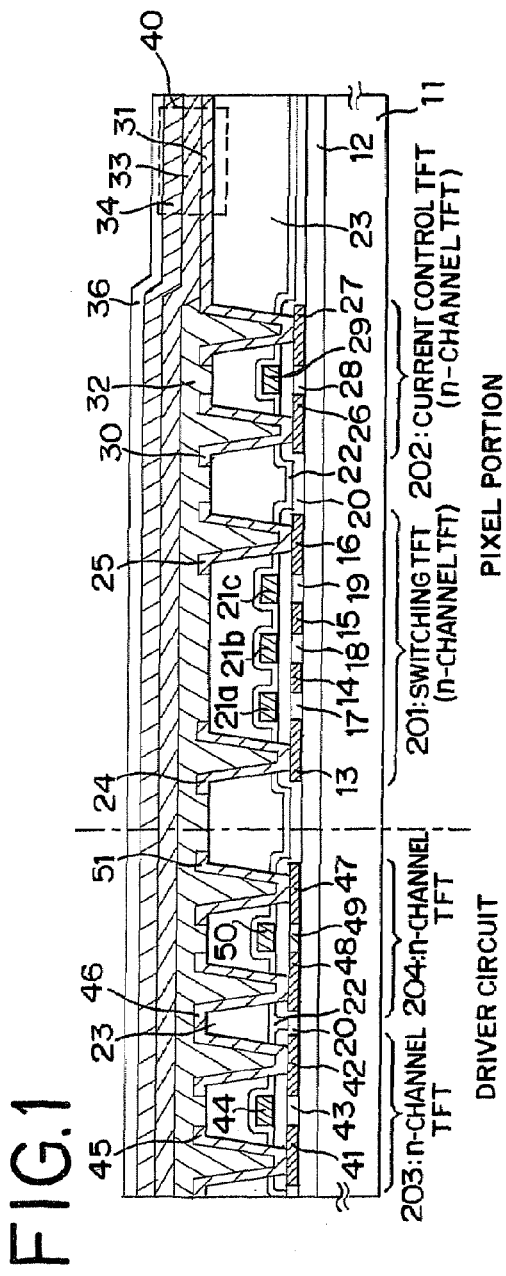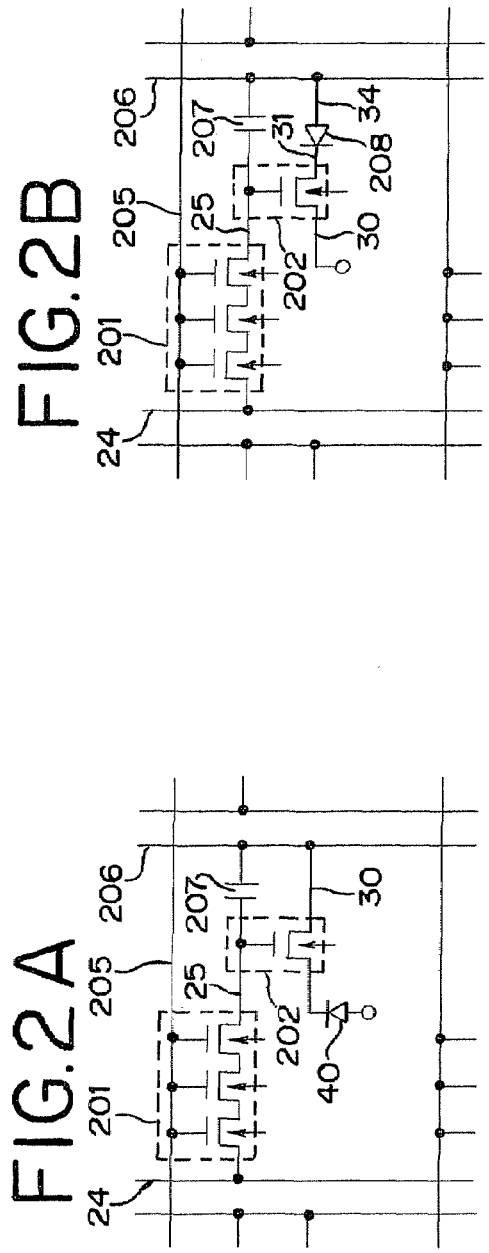

FIG.3A
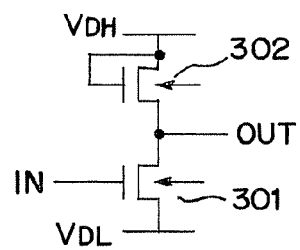
FIG.3B
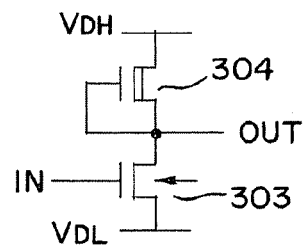
FIG.4A
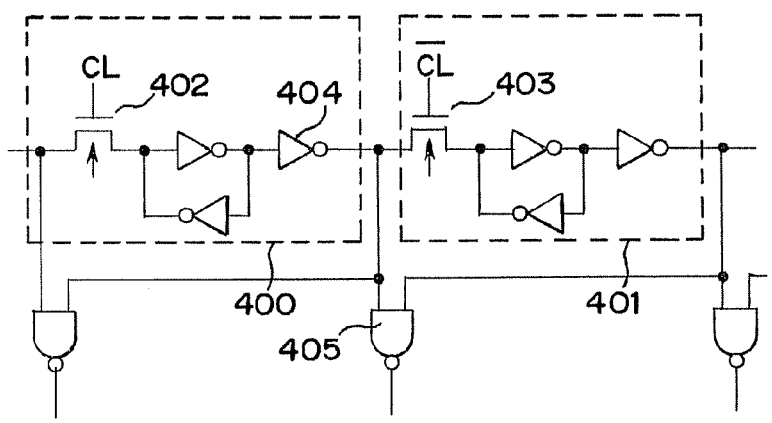
FIG.4B
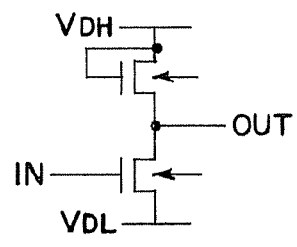  or  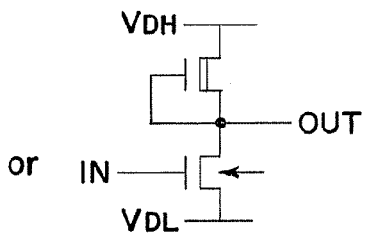
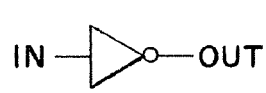   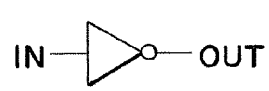

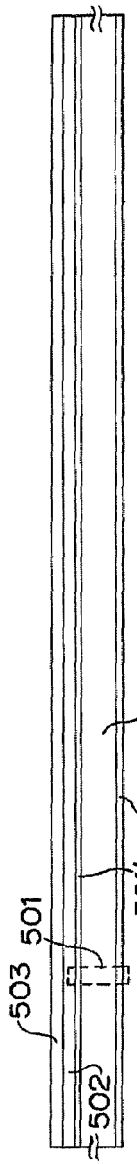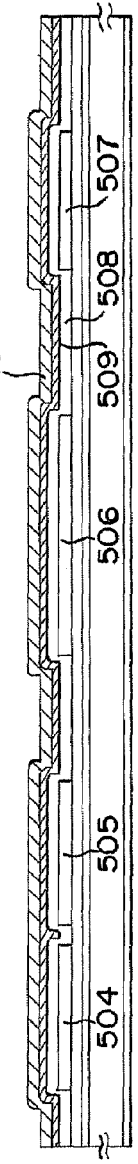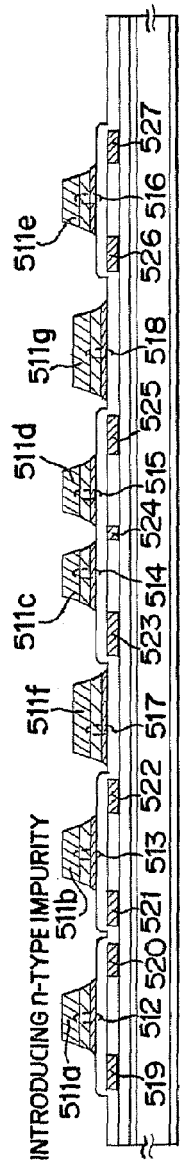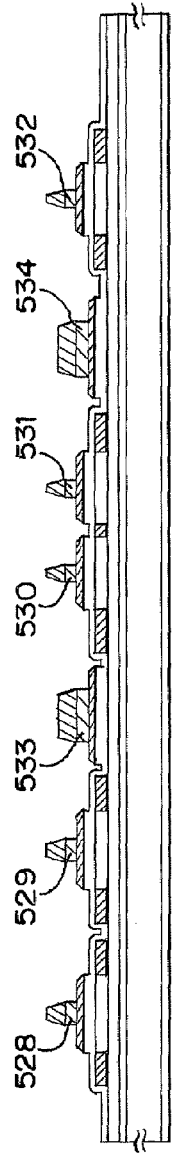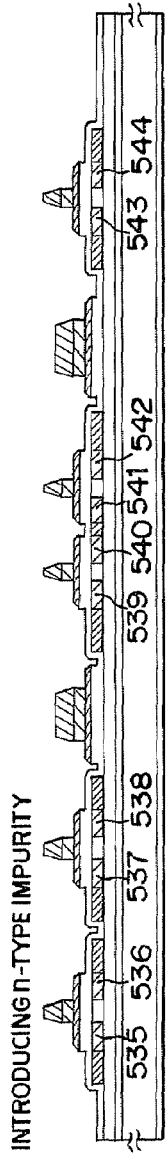

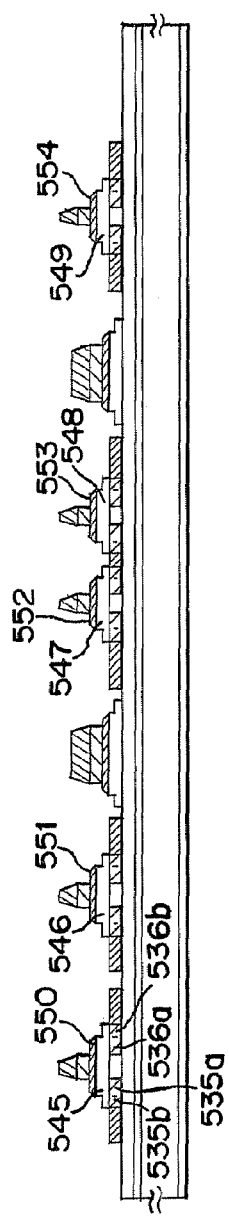
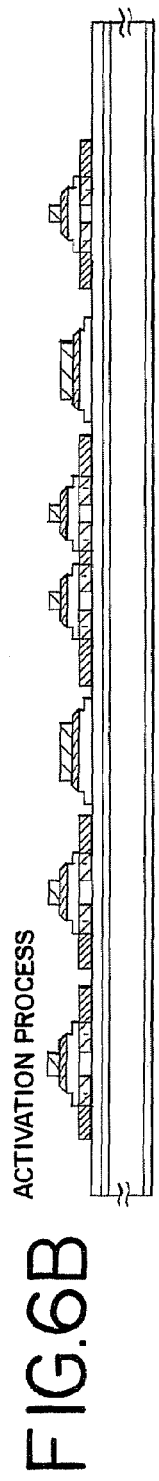
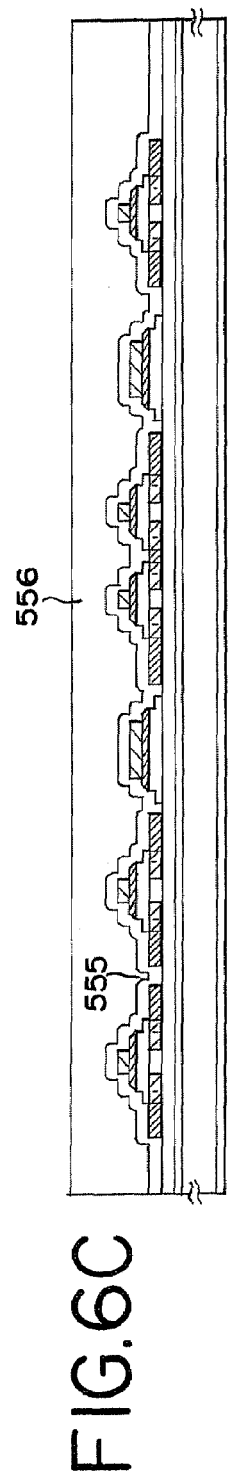
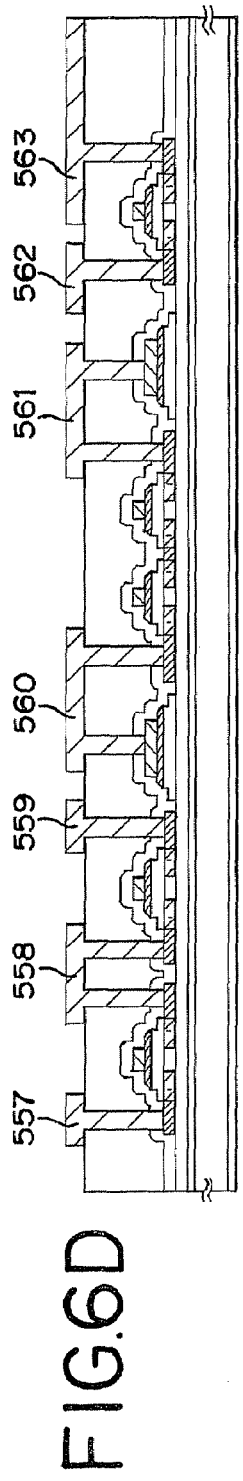
FIG.6A
FIG.6B
FIG.6C
FIG.6D

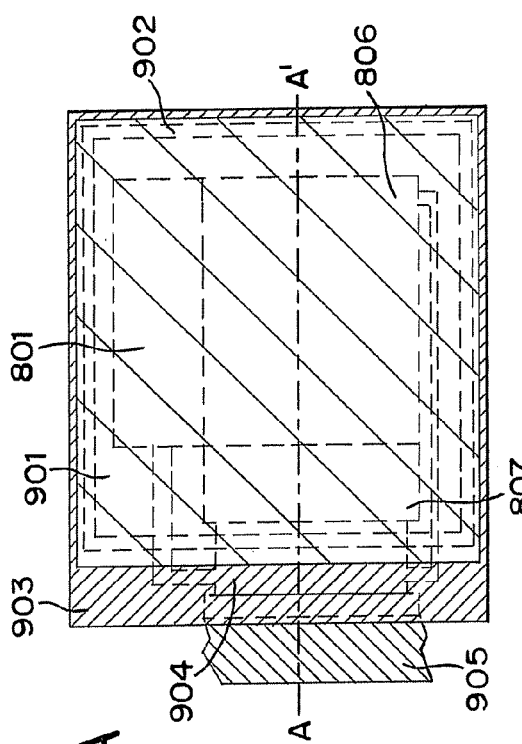
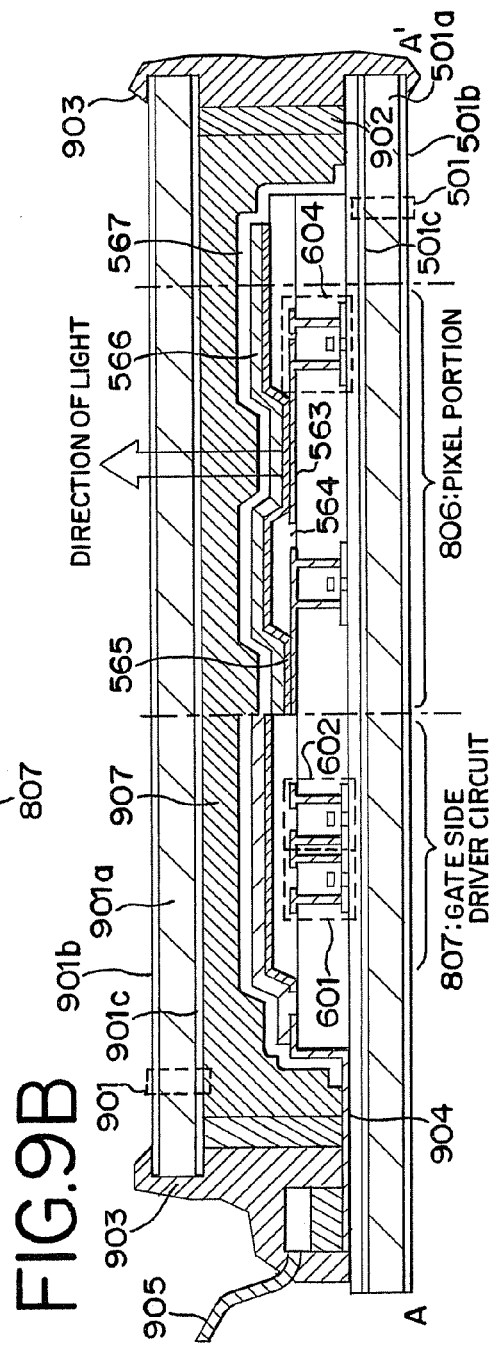
FIG.9A
FIG.9B

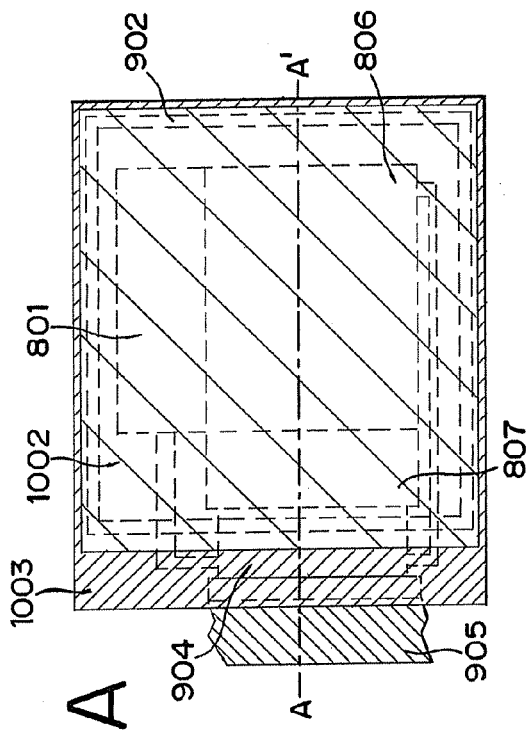
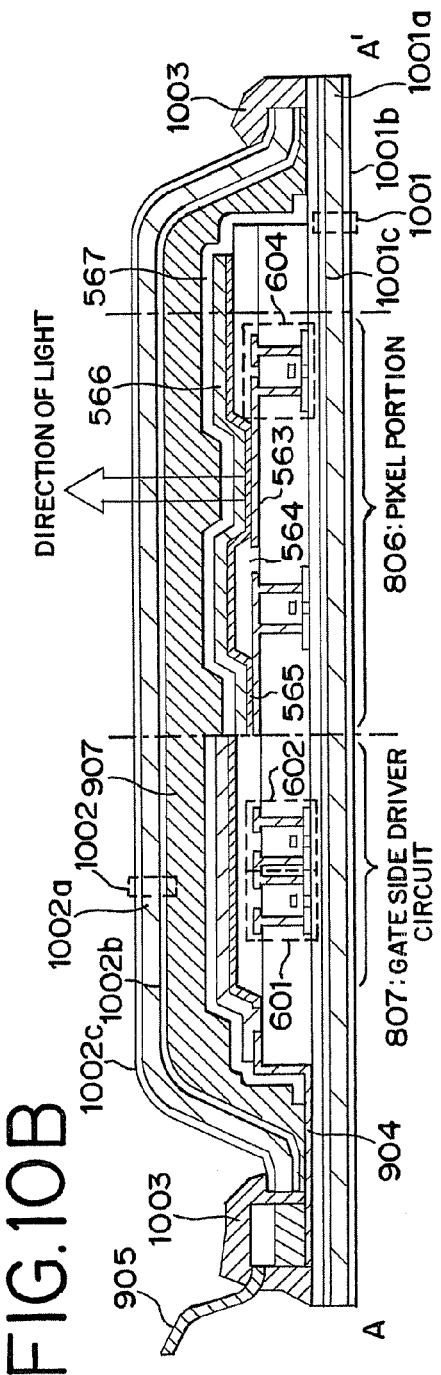
FIG.10A
FIG.10B

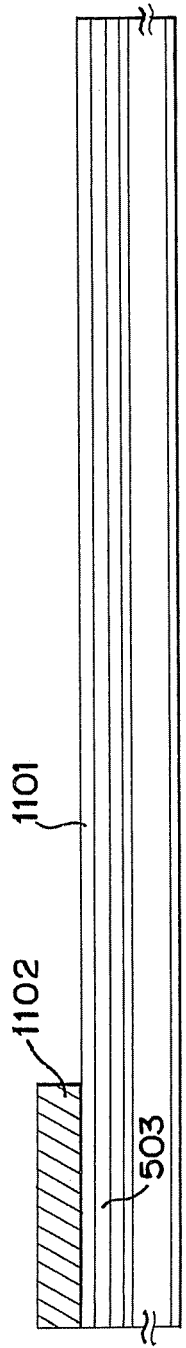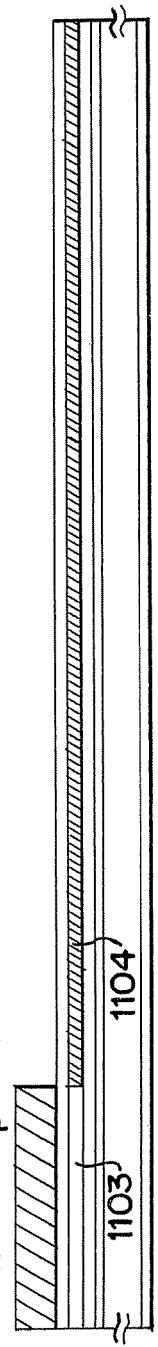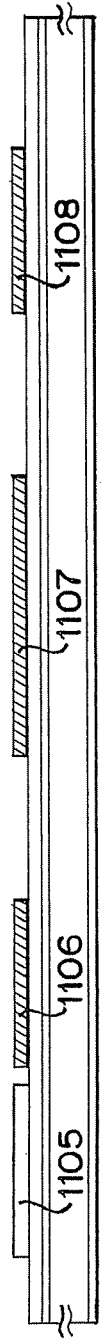

LIGHT-EMITTING DEVICE AND ELECTRIC APPLIANCE

BACKGROUND OF THE INVENTION

1. Field of the Invention

The present invention relates to a light-emitting device which includes an insulating member, a pixel portion and driver circuits for supplying signals to the pixel portion, and in which the pixel portion and the driver circuits are formed on the same insulating member. Specifically, the present invention includes techniques effective in improving a device having an element constituted of a pair of electrodes and a thin film of a light-emitting material interposed between the pair of electrodes (which element will be hereinafter referred to as "light-emitting element") (which device will be hereinafter referred to as "light-emitting device"). The light-emitting device of the present invention covers an organic electroluminescent (EL) display and an organic light-emitting diode (OLED).

In particular, the present invention includes techniques effective in improving a device having an element constituted of an anode, a cathode, and a thin film of a light-emitting material capable of electroluminescence and interposed between the pair of electrodes (which thin film will be hereinafter referred to as "EL film") (which element will be hereinafter referred to as "EL element") (which device will be hereinafter referred to as "EL light-emitting device").

Light-emitting materials usable in the present invention comprise all of light-emitting materials capable of emitting light (phosphorescence and/or fluorescence) by singlet excitation, triplet excitation, or both of singlet and triplet excitation.

The present invention can also be applied to a device having an element in which a liquid crystal material is interposed between electrodes (which element will be hereinafter referred to as "liquid crystal element") (which device will be hereinafter referred to as "liquid crystal display device").

2. Description of the Related Art

In recent years, the development of active-matrix EL light-emitting devices have been promoted. In active-matrix EL light-emitting devices, thin-film transistors (hereinafter referred to as "TFTs") are provided in each of pixels (EL elements) of the pixel portion, and the current caused to flow through each EL element is controlled through the TFTs to control the luminance of the pixel. Therefore, voltages can be uniformly supplied to the pixels even if the number of pixels to be formed by the pixel portion is increased. For this reason, active-matrix EL light-emitting devices are suitable for forming a high-definition image.

Active-matrix EL light-emitting devices also have the advantage that circuits including a shift register and a latch or a buffer constituting driver circuits for transmitting signals to the pixel portion can be formed by TFTs on one insulating member on which the pixel portion is also formed. Therefore, when an EL light-emitting device of this structure is manufactured, it can be designed so as to be remarkably small in size and weight.

Active-matrix EL light-emitting devices, however, have a drawback in that a complicated TFT fabrication process increases the manufacturing cost of the device. Moreover, since a plurality of TFTs are formed simultaneously, the manufacturing process may be so complicated that it is difficult to ensure a satisfactory yield. In particular, an operation failure in the driver circuits may result in a line defect such that one row of pixels do not operate.

FIGS. 18A and 18B show the basic structure of an active-matrix EL light-emitting device. Referring to FIG. 18A, a TFT 1802 for controlling a current flowing through an EL element (hereinafter referred to as "current control TFT") is formed on a substrate 1801, and an anode 1803 is connected to the current control TFT 1802. An organic EL film (thin film of a light-emitting organic material capable of producing electroluminescence) 1804 and a cathode 1805 are formed on the anode 1803. Thus, an EL element 1806 constituted of the anode 1803, the organic EL film 1804 and the cathode 1805 is formed.

In this light-emitting EL device, light produced in the organic EL film 1804 passes through the anode 1803 to travel in the direction of the arrow indicated in the figure. The current control TFT 1802 acts as a shielding such as to block light emitted to travel to an observer and to cause a reduction in the effective emission region (a region through which the observer can observe emission of light). If the effective emission region is reduced, a need arises to increase the intensity of light emitted from the organic EL film in order to obtain a bright image. This can be achieved by increasing the voltage at which the organic EL element film is driven. However, if the drive voltage is increased, there is apprehension that the degradation the organic EL element film is promoted.

An active-matrix EL light-emitting device of a structure such as shown in FIG. 18B, designed to solve this problem, has been proposed. Referring to FIG. 18B, a current control TFT 1807 is formed on a substrate 1801, and a cathode 1808 is connected to the current control TFT 1807. An organic EL film 1809 and an anode 1810 are formed on the cathode 1808. Thus, an EL element 1811 constituted of the cathode 1808, the organic EL film 1809 and the anode 1810 is formed. That is, the structure of the EL element 1811 is in an inverse directional relationship with that of the EL element 1806 shown in FIG. 18A.

In this active-matrix EL light-emitting device, most of light traveling to the cathode 1808 side after being produced by the organic EL film 1809 is reflected by the cathode 1808 to be emitted through the anode 1810 in the direction arrow indicated in the figure. Therefore, the whole of the region where the cathode 1808 is formed can be used as an effective light-emitting region, so that an active-matrix EL light-emitting device having a high light extraction efficiency can be obtained. Further, even if the drive voltage is low, a high intensity of emitted light can be obtained to provide a bright image.

SUMMARY OF THE INVENTION

In view of the above-described circumstances, an object of the present invention is to provide a light-emitting device having a high light extraction efficiency and designed so as to be manufactured at a low cost.

Another object of the present invention is to provide a light-emitting device low-priced but capable of displaying a bright image.

Still another object of the present invention is to provide a low-priced electric appliance using the light-emitting device of the present invention in its display portion and therefore capable of displaying a bright image.

The inventors of the present invention have conceived that it is desirable to use an n-channel TFT as a current control TFT in the case of manufacturing an EL light-emitting device having a high light extraction efficiency as shown in FIG. 18B to have a high light extraction efficiency. The reason for this conception will be explained with reference to FIGS. 19A and 19B.

FIG. 19A shows an example of use of a p-channel TFT 1901 as the current control TFT in the structure shown in FIG. 18B. The current control TFT 1901 has its source connected to a current supply line 1902 and its drain connected to the cathode of an EL element 1903. In this structure, it is necessary to set the potential of the current supply line 1902 to $V_L$ (low-level potential equal to ground potential in this example) and to set the potential of the anode of the EL element 1903 to $V_H$ (high-level potential of 5 to 10 V in this example).

The potential of the gate of the current control TFT 1901 is $V_G$, the potential of the source is $V_S$, and the potential of the drain is $V_D$. Then the current control TFT 1901 has a gate voltage expressed as $V_G$-$V_S$, a voltage between the source and the drain as $V_D$-$V_S$, a source voltage as $V_S$-$V_L$, and a drain voltage as $V_D$-$V_L$. $V_S$ corresponds to the potential of the cathode of the EL element 1903. When the gate of the current control TFT 1901 is opened, the potential of the current supply line 1902 become closer to $V_L$. The potential $V_D$ of the drain is equal to the potential $V_L$ of the current supply line 1902.

In the case of the structure shown in FIG. 19A, potential $V_S$ changes (becomes closer to $V_L$) when the current control TFT 1901 is opened. Under this condition, the gate voltage ($V_G$-$V_S$) and the voltage ($V_D$-$V_S$) between the source and the drain themselves change. As a result, the current flowing through the current control TFT 1901 changes with the change in $V_S$ and there is a problem of failure to supply the current to the EL element 1903 with stability.

FIG. 19B shows an example of use of a current control TFT as the n-channel TFT in the structure shown in FIG. 18B. In this case, the potential $V_S$ of the source of the current control TFT 1904 is always equal to the potential $V_L$ of the current supply line 1902, so that the gate voltage ($V_G$-$V_S$) and the voltage ($V_D$-$V_S$) between the source and the drain do not change. Therefore, a current can be supplied to the EL element 1903 with stability.

From the above-described facts, the inventors of the present invention have understood that in a case where a pixel is formed as the structure in which the cathode of the EL element is connected to the drain of the current control TFT, it is desirable to use an n-channel TFT as the current control TFT.

The present invention achieved with this understanding is characterized in that all semiconductor elements (typically, thin-film transistors) are formed as n-channel semiconductor elements in order to reduce the manufacturing cost of the active-matrix light-emitting device. The number of the steps for fabricating p-channel semiconductor elements are reduced to simplify the process of manufacturing the light-emitting device and to enable the light-emitting device to be manufactured at a lower cost.

The present invention is also characterized by forming driver circuits only of n-channel semiconductor elements. That is, according to the present invention, only n-channel semiconductor elements are combined to form a driver circuit while ordinary driver circuits are designed on the basis of a complementary metal-oxide semiconductor (CMOS) circuit in which an n-channel semiconductor element and a p-channel semiconductor element are complementarily combined.

FIG. 1 shows an active-matrix EL light-emitting device in an embodiment of the present invention in which a pixel portion and driver circuits for transmitting signals to the pixel portion are formed on one insulating member.

Referring to FIG. 1, an insulating film 12 is formed as a base on a substrate 11, and a TFT 201 which operates as a switching device (hereinafter referred to as "switching TFT"), a TFT 202 which operates as a current-control element (hereinafter referred to as "current control TFT"), an n-channel TFT 203, and an n-channel TFT 204 are formed on the insulating film 12. The switching TFT 201 and the current control TFT 202 are illustrated as an example of TFTs provided in the pixel portion while the n-channels TFT 203 and 204 are illustrated as an example of semiconductor elements in an inverter circuit provided in a driver circuit.

The present invention comprises techniques particularly effective in forming the light-emitting device on a plastic substrate (including a plastic film) used as a substrate 11. Presently, no techniques for enabling p-channel TFTs formed on a plastic substrate to have satisfactory electrical characteristics are available. Therefore, the present invention comprising forming all the TFTs as n-channel TFTs is particularly effective in fabricating an active-matrix EL light-emitting device on a plastic substrate.

The pixel portion will first be described. The switching TFT 201 is an n-channel TFT which includes an active layer containing a source region 13, a separation region (impurity region existing between channel forming regions) 14, a separation region 15, a drain region 16, and channel forming regions 17 to 19, a gate insulating film 20, gate electrodes 21a to 21c, an inorganic insulating film 22, an organic insulating film 23, source wiring 24, and drain wiring 25. The switching TFT 201 is a switching element for controlling the gate voltage of the current control TFT.

The inorganic insulating film 22 is a silicon nitride film or a silicon oxynitride (represented by SiOxNy), and the organic insulating film 23 is a resin film (polyimide film, acrylic resin film, polyamide film, or benzocyclobutene film). Metal particles or carbon particles may be dispersed in the organic insulating film 23. In such a case, the content of metal particles or carbon particles may be adjusted so that the specific resistance is $1\times10^8$ to $1\times10^{10}$ Ωm thereby limiting occurrence of static electricity.

Preferably, a metallic film containing an element belonging to the group 1 or 2 in the periodic table (preferably, cesium, magnesium, lithium, calcium, potassium, barium or beryllium) is used for the source wiring 24 and the drain wiring 25. The metallic film is, preferably, aluminum film, copper film or silver film. Bismuth film may also be used as the metallic film.

The current control TFT 202 is an n-channel TFT which includes an active layer containing a source region 26, a drain region 27, and a channel forming region 28, gate insulating film 20, a gate electrode 29, inorganic insulating film 22, organic insulating film 23, source wiring 30, and a pixel electrode 31. A drain wiring 25 portion extending from the switching TFT 201 is connected to the gate electrode 29 of the current control TFT 202. The pixel electrode 31 connected to the drain region 27 of the current control TFT 202 functions as a cathode of an EL element 40.

Preferably, a metallic film containing an element belonging to the group 1 or 2 in the periodic table (preferably, cesium, magnesium, lithium, calcium, potassium, barium or beryllium) is used to form the pixel electrode 31. The metallic film is, preferably, aluminum film, copper film or silver film. Bismuth film may also be used as the metallic film.

Needless to say, the source wiring 24 and the drain wiring 25 for the switching TFT 201 and the source wiring 30 for the current control TFT 202 are formed simultaneously with the pixel electrode 31, so that the same material as that of the pixel electrode 31 is used to form the wiring.

A bank 32 is also formed which is a resin film (polyimide film, acrylic resin film, polyamide film, or benzocyclobutene film) containing metal particles or carbon particles such that the specific resistance is $1\times10^8$ to $1\times10^{10}$ Ωm. If the specific resistance is within this range, it is possible to reduce occurrence of electrostatic breakdown of the TFT at the time of film forming. A thin film 33 comprising an organic EL film and an anode 34 of the EL element 40 (typically, an electrode formed of an oxide conductive film) are also provided.

Further, a passivation film 36 is formed so as to cover the EL element 40 formed of the pixel electrode (cathode) 31, the thin film 33, comprising an organic EL film, and the anode 34. To form the passivation film 36, silicon nitride film, silicon oxynitride film, carbon film (preferably, diamond-like carbon film), aluminum oxide film or tantalum oxide film may be used. A multilayer film formed of a combination of some of these films may be formed.

FIGS. 2A and 2B show the circuit configuration of one pixel-forming segment in the pixel portion. Referring to FIG. 2A, a gate wiring line 205 is provided to apply a gate voltage to the gate electrodes 21a to 21c of the switching TFT 201, and a current supply line 206 is provided to supply a current which flows through the EL element 40. A capacitor 207 is provided to hold a gate voltage applied to the gate electrode 29 of the current control TFT 202. The source wiring 30 portion at the current control TFT 202 is set to a low-level potential ($V_L$) while the anode 34 of the EL element is set to a high-level potential ($V_H$).

FIG. 2B shows another example of the circuit configuration of one pixel. In the circuit configuration shown in FIG. 2B, an EL element 208 is formed between the current supply line 206 and the current control TFT 202. In this case, the source wiring portion 30 at the current control TFT 202 is set to a high-level potential ($V_H$) while the anode 34 of the EL element is set to a low-level potential ($V_L$). Also, the current supply line 206 functions as the anode 34 of the EL element.

Examples of the circuit having two TFTs (one switching TFT and one current control TFT) for one pixel have been described. However, the number of TFTs may be three, four, five, six or more. That is, it is possible to provide TFTs for control signals other than a video signal in addition to the switching TFT for changing the video signal input from the source wiring 24 and the current control TFT for controlling the amount of current flowing through the EL element 40.

The driver circuit will next be described with reference to FIG. 1. The n-channel TFT 203 includes an active layer containing a source region 41, a drain region 42, and a channel forming region 43, gate insulating film 20, a gate electrode 44, inorganic insulating film 22, organic insulating film 23, source wiring 45, and drain wiring 46.

The n-channel TFT 204 includes an active layer containing a source region 47, a drain region 48, and a channel forming region 49, gate insulating film 20, a gate electrode 50, inorganic insulating film 22, organic insulating film 23, source wiring 51, and drain wiring 46 common to the n-channel TFTs 203 and 204.

The source wiring 45 for the n-channel TFT 203, the drain wiring 46 (common to the n-channel TFTs 203 and 204) and the source wiring 51 for the n-channel TFT 204 are formed of the same material as the pixel electrode 31.

Each of the TFTs in this embodiment mode is formed as an enhancement type of n-channel TFT (hereinafter referred to as "E-type NTFT".) However, one of the n-channel TFTs 203 and 204 may be formed as a depletion type. In such a case, an element belonging to the group 15 in the periodic table (preferably, phosphorus) or an element belonging to the group 13 in the periodic table (preferably, boron) may be added to the semiconductor in the channel forming region to selectively fabricate the enhancement type and depletion type.

In a case where an NMOS circuit is formed by combining the n-channel TFTs 203 and 204, it is formed as a combination of enhancement-type TFTs (hereinafter referred to as "EEMOS circuit") or a combination of depletion-type and enhancement-type TFTs (hereinafter referred to as "EDMOS circuit").

FIG. 3A shows an example of the EEMOS circuit, and FIG. 3B shows an example of the EDMOS circuit. Each of components 301 and 302 shown in FIG. 3A is an E-type NTFT. Components 303 and 304 shown in FIG. 3B are an E-type NTFT and a depletion type of n-channel TFT (hereinafter referred to as "D-type NTFT"), respectively.

In FIGS. 3A and 3B, $V_{DH}$ designates a power supply line to which a positive voltage is applied (positive power supply line), and $V_{DL}$ designates a power supply line to which a negative voltage is applied (negative power supply line). The negative power supply line may be a ground-potential power supply line (grounded power supply line).

FIGS. 4A and 4B show an example of a shift register formed by using the EEMOS circuit shown in FIG. 3A or the EDMOS circuit shown in FIG. 3B. Portions 400 and 401 of FIG. 4A are flip-flop circuits. Components 402 and 403 are E-type NTFTs. A clock signal (CL) is input to the gate of the E-type NTFT 402, and a clock signal (CL-bar) of the opposite polarity is input to the gate of the E-type NTFT 403. A symbol indicated by 404 represents an inverter circuit. To form this inverter circuit, the EEMOS circuit shown in FIG. 3A or the EDMOS circuit shown in FIG. 3B is used, as shown in FIG. 4B.

According to the embodiment mode of the present invention, all the TFTs are formed as n-channel TFTs so that the need for the process steps for forming p-channel TFTs is simplified, thereby simplifying the process of manufacturing the EL light-emitting device. The yield of the manufacturing process is thereby improved and the manufacturing cost of the EL light-emitting device can be reduced.

BRIEF DESCRIPTION OF THE DRAWINGS

FIG. 1 is a cross-sectional view of the structure of a light-emitting device;

FIGS. 2A and 2B are diagrams each showing the configuration of a circuit in the pixel portion of the light-emitting device shown in FIG. 1;

FIGS. 3A and 3B are diagrams each showing the configuration of an NMOS circuit;

FIGS. 4A and 4B are diagrams showing the configuration of a shift register;

FIGS. 5A to 5E are diagrams showing process steps for fabricating an EL light-emitting device;

FIGS. 6A to 6D are diagrams showing process steps for fabricating the EL light-emitting device;

FIG. 9 comprises a top view and a cross-sectional view of an example of the structure of the EL light-emitting device;

FIG. 10 comprises a top view and a cross-sectional view of another example of the structure of the EL light-emitting device;

FIGS. 11A, 11B, and 11C are diagrams showing process steps for fabricating the EL light-emitting device;

DETAILED DESCRIPTION OF THE PREFERRED EMBODIMENTS

Embodiment 1

Figure 7:
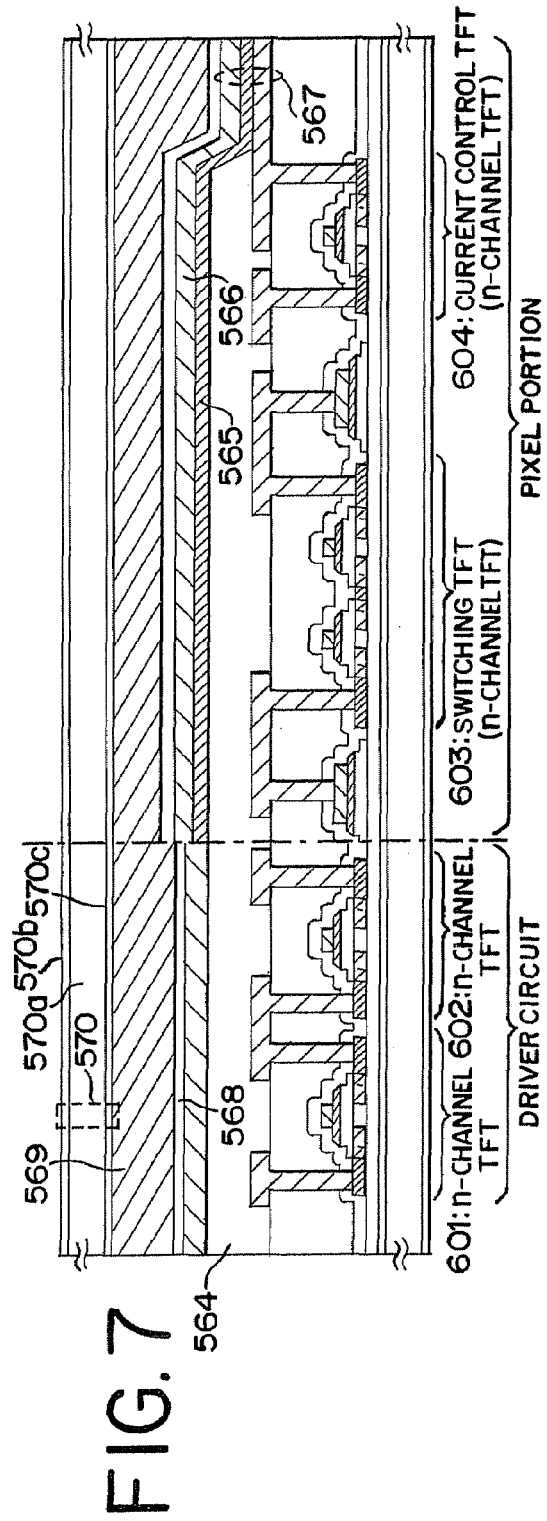
FIG. 7 is a diagram showing process steps for fabricating the EL light-emitting device.

In this embodiment, the method of manufacturing the pixel portion and the driver circuit to be formed in the periphery thereof on the same insulating body is explained. However, to simplify the explanation, the NMOS circuit combining the n-channel TFT in regards to the driver circuit is shown.

As shown in FIG. 5A, first an insulator 501 made of plastic is prepared. In this embodiment, as an insulator 501 made of plastic, an insulator coated with protecting films (carbon film, specifically a diamond-like carbon film) 501b and 501c on both sides (the front surface and the back surface) of a plastic substrate 501a is prepared.

Next, a base film 502 is formed covering the insulator 501 with a thickness of 300 nm. In this embodiment, a silicon nitride oxide film is laminated by a sputtering method to form the base film 502. At this time, a nitrogen concentration of layers contacting the insulator 501 is made to be 10 to 25 wt %, and nitrogen may be included higher than other layers.

On the base film 502 is formed an amorphous semiconductor film (not shown) with a thickness of 50 nm by a sputtering method. Since the insulator 501 is plastic, the film formation temperature desirably does not exceed 200° C. (preferably 150° C.).

Note that, there is no need to limit to the amorphous semiconductor film, provided that the semiconductor film includes the amorphous structure (includes a microcrystalline semiconductor film). As an amorphous semiconductor film, an amorphous silicon or an amorphous silicon germanium film may be used with the thickness of 20 to 100 nm.

Then a known laser crystallization technique for a process of crystallizing the amorphous semiconductor film is performed to form a crystalline semiconductor film 503. Note that, in this embodiment a solid laser (specifically, a second harmonic of a Nd: YAG laser) is used, but an excimer laser may be used. Further, the crystallization technique may be any method in a range that heat resistance of the insulator 501 made of plastic allows.

Next, as shown in FIG. 5B, the crystalline semiconductor film 503 is etched by the first photolithography step, forming island shape semiconductor layers 504 to 507. These are semiconductor films to become active layers of the TFT later on.

Note that in this embodiment the crystalline semiconductor film is used as active layers of the TFT, but an amorphous semiconductor film may be used as the active layers. Now, in this embodiment a protecting film (not shown) is formed from a silicon oxide film on semiconductor layers 504 to 507 to a thickness of 130 nm by a method of sputtering. Impurity elements with a p-type semiconductor (hereinafter referred to as p-type impurity element) is added to semiconductor films 504 to 507. As the p-type impurity element, an element belonging to group 13 of the periodic table (typically boron or gallium) may be used. Note that, the protecting film is provided so that the crystalline silicon film is not directly exposed to plasma when the protecting film is added with impurity and that minute concentration control is made possible.

Note that, the concentration of the p-type impurity element added at this time is $1\times10^{15}$ to $5\times10^{17}$ atoms/cm$^3$ (typically $1\times10^{16}$ to $1\times10^{17}$ atoms/cm$^3$). The p-type impurity element added with this concentration is used to regulate the threshold voltage of the n-channel TFT.

Next, the surface of the semiconductor films 504 to 507 are cleaned. First, the surface is cleaned using pure water containing ozone. Since a thin oxide film is formed on the surface, then the thin oxide film is removed using a fluoro solution diluted to 1%. With this processing, the contaminants stuck onto the surface of the semiconductor films 504 to 507 may be removed. The concentration of ozone is preferably 6 mg/L or more. The series of steps is performed without exposure to the air.

The gate insulating film 508 is formed covering the semiconductor films 504 to 507 by the sputtering method. As a gate insulating film 508, an insulating film containing silicon with a thickness of 10 to 200 nm, preferably 50 to 150 nm may be used. This may be a single layer structure or a lamination layer structure. In this embodiment, a silicon nitride oxide film with a thickness of 115 nm is used.

In this embodiment, the cleaning of the surface of the semiconductor films 504 to 507 to the formation of the gate insulating film 508 is performed without exposure to the air, and the contamination and interface levels are reduced in the interface of the semiconductor films 504 to 507 and the gate insulating film 508. In this case, an apparatus of a multi-chamber method (or an in-line method) having at least a cleaning room and a sputtering room may be used. Then, as a first conductive film 509 a tantalum nitride film with a thickness of 30 nm and further as a second conductive film 510 a tungsten film with a thickness of 370 nm are formed. In this embodiment, a combination of a tungsten film as the first conductive film and an aluminum alloy film as the second conductive film, or a combination of a titanium film as a first conductive film and a tungsten film as a second conductive film may be used. These metal films may be formed by a sputtering method. Further, if inert gas such as Xe and Ne are added as sputtering gas, the film peeling due to stress can be prevented. Further, the purity of tungsten target may be made 99.9999% to form a low resistance tungsten film with a resistivity of 20 μΩcm or less. Note that, it is possible to perform the above described surface cleaning of semiconductor films 504 to 507 to the formation of the second conductive film 510 without exposure to the air. In this case, an apparatus with a multi-chamber method (or an in-line method) having at least a cleaning room, a sputtering room for forming an insulating film and a sputtering room for forming a conductive film may be used.

Next, the resist masks 511a to 511g are formed and the first conductive film 509 and the second conductive film 510 are then etched. Note that in this specification, the etching process is referred to as the first etching process (See FIG. 5C).

In this embodiment, an ICP (Inductively Coupled Plasma) etching method is used. Thereafter, a mixture of gases of carbon tetrafluoride (CF$_4$) gas, chlorine (Cl$_2$) gas and oxygen (O$_2$) gas are used as the etching gases, under a pressure of 1 Pa. The gas flow rate of each gas is set as $2.5\times10^{-5}$ m$^3$/min for carbon tetrafluoride gas, $2.5\times10^{-5}$ m³/min for chlorine gas, and $1.0\times10^{-5}$ m³/min for oxygen gas.

An RF power (13.56 MHz) of 500 W is applied to a coil type electrode under this state to generate plasma. Further, an RF power (13.56 MHz) of 150 W is applied as a self bias voltage to the stage where the substrate is on so that a negative self bias is applied to the substrate. The etching condition, is referred to as the first etching condition.

Thus, the second conductive film (tungsten film) 510 is selectively etched. Since oxygen is added to the etching gas, the progress of the etching of the first conductive film (tantalum nitride film) becomes extremely slow. Further, utilizing regression of the resist masks 511*a* to 511*e*, the shape becomes a taper shape having a taper angle of 15 to 45°. With the first etching condition, a taper angle of 25° may be obtained.

Note that, taper refers to a portion where the end surface of the end portion of the electrode is oblique, and the angle with the base is called the taper angle. Further, the taper shape refers to a shape where the electrode end portion has become oblique with a taper angle, and a trapezoid is included in the taper shape.

Next, etching is performed using as the etching gas a mixture gas of carbon tetrafluoride gas and chlorine gas. At this time, the pressure is 1 Pa, the flow rate of each gas is set as $3.0\times10^{-5}$ m³/min for both carbon tetrafluoride gas and chlorine gas. Further, an RF power of 500 W is applied to a coil type electrode, an RF power of 20 W is applied as a self bias voltage to the stage where the substrate is on. This condition is referred to as the second etching condition.

In this way, gate electrodes 512 to 516 and a source wiring 517 and a drain wiring 518 of the switching TFT are formed from a lamination film of a first conductive film and a second conductive film.

Next, with the gate electrodes 512 to 516 and the source wiring 517 and the drain wiring 518 as masks, an n-type impurity elements (in this embodiment phosphorus) are added in a self aligning manner. The impurity regions 519 to 527 formed in this way contain n-type impurity elements at a concentration of $1\times10^{20}$ to $1\times10^{21}$ atoms/cm³ (typically $2\times10^{20}$ to $5\times10^{21}$ atoms/cm³). These impurity regions 519 to 527 form the source region and the drain region of the n-channel TFT.

Next, an etching of gate electrodes is carried out by using the resist masks 511*a* to 511*g* as is. This etching condition in the first etching condition, is to have a self bias voltage of 20 W. With this condition, only the second conductive film (tungsten film) is selectively etched, to form gate electrodes (hereinbelow referred to as second gate electrodes) 528 to 532 made from the second conductive film, a source wiring (hereinbelow referred to as second source wirings) 533 made of the second conductive film, and a drain wiring (hereinbelow referred to as second drain wirings) 534 made of the second conductive film (FIG. 5D).

Next, as shown in FIG. 5E, the n-type impurity element (in this embodiment phosphorus) is added by using the resist masks 511*a* to 511*g* as is. In this process, the second gate electrodes 528 to 532 function as masks, and n-type impurity regions 535 to 544 containing the n-type impurity element at a concentration of $2\times10^{16}$ to $5\times10^{19}$ atoms/cm³ (typically $5\times10^{17}$ to $5\times10^{18}$ atoms/cm³) are formed. Note that, in this specification the impurity region added with the n-type impurity element at such a concentration is referred to as the n-type impurity region (b).

Note that, as the adding condition, an accelerating voltage is set high to 70 to 120 kV (in this embodiment 90 kV) so that the phosphorus passes through the first conductive film and the gate insulating film to reach the semiconductor film.

Next, as shown in FIG. 6A, the gate insulating film 508 is etched by a dry etching method, to form gate insulating films 545 to 549 which are independent from each other. Note that, in this embodiment, an example of etching the gate insulating film to expose the n-type impurity regions (a) 519 to 527 is shown, but a gate insulating film may remain on the surface of the n-type impurity regions (a) 519 to 527.

In this etching condition, as the etching gas, $CHF_3$ (carbon trifluoride) gas is made to flow at a flow amount of $3.5\times10^{-5}$ m³/min, and the etching pressure is $7.3\times10^3$ Pa. Further, the applied power is 800 W.

At this time, the first conductive film (tantalum nitride film) is simultaneously etched, and the gate electrodes (hereinafter referred to as the first gate electrode) 550 to 554 are formed from the first conductive film. Therefore, the EL light-emitting device shown in this embodiment has a gate electrode with a structure of a lamination of a first gate electrode and a second gate electrode.

Next, as shown in FIG. 6A, the first gate electrode 550 overlaps with a portions of the n-type impurity regions (b) 535 and 536 (overlaps through the gate insulating film 545). Namely, the n-type impurity regions (b) 535 and 536 include the regions 535*a* and 536*a* overlapping the first gate electrode 550 through the gate insulating film 545, and the regions 536*a* and 536*b* that do not overlap with the first gate electrode 550 through the gate insulating film 545.

Note that, the first gate electrode 550 functions as a part of the gate electrode, and the regions 535*a* and 535*b* overlapping the first gate electrode 550 through the gate insulating film 545, are effective in reducing the hot carrier effect. Accordingly, it is possible to suppress the deterioration due to the hot carrier effect. The above characteristics are common to all TFTs.

Next, as shown in FIG. 6B, the added n-type impurity element is activated. As an activating means, laser annealing is preferable. Of course, if the heat resistivity of the plastic substrate 501*a* allows a method of lamp annealing, furnace annealing or a combination of these with laser annealing, it may be used. Note that, the oxygen concentration of the treatment atmosphere at this time is preferably kept very low. This is to prevent oxidation of the gate electrode, and preferably the oxygen concentration is 1 ppm or less.

Next, as shown in FIG. 6C, an inorganic insulating film 555 made of a silicon nitride film or a silicon nitride oxide film is formed with a thickness of 50 to 200 nm. The inorganic insulating film 555 may be formed by a sputtering method.

Thereafter, hydrogenation treatment is performed by a plasma processing using hydrogen ($H_2$) gas or ammonia ($NH_3$) gas. When hydrogenation treatment is completed, as an organic insulating film 556, a resin film which transmits visible light is formed to a thickness of 1 to 2 μm. As a resin film, a polyimide film, a polyamide film, an acrylic resin film or a BCB (benzocyclobuten) film may be used. Further, it is possible to use a photosensitive resin film.

Note that, in this embodiment, a lamination film of an inorganic insulating film 555 and an organic insulating film 556 is called an interlayer insulating film.

Next, as shown in FIG. 6D, a contact hole is formed in the interlayer insulating film, and wirings 557 to 562 and a pixel electrode 563 are formed. Note that, in this embodiment, the wiring is a lamination film of three layers structured with from the lower layer side, a titanium film with a thickness of 50 nm, an aluminum film containing titanium with a thickness of 200 nm, and an aluminum film containing lithium with a thickness of 200 nm formed continuously by a sputtering method. Further, a vaporization method may be used in formation of only an aluminum film containing lithium. However, in such a case continuous formation without exposure to the air is preferable. Here, it is important for the surface of the pixel electrode 563 to be a metal surface with a small work function. This is because the pixel electrode 563 functions as the cathode of the EL element as it is. Therefore, it is preferable at least for the surface of the pixel electrode 563 to be a metal film containing an element belonging to group 1 or 2 of the periodic table or a bismuth (Bi) film. Further, the wirings 557 to 562 are formed simultaneously with the pixel electrode 563 so that they are formed with the same conductive film.

At this time, the wirings 557 and 559 function as a source wiring of a NMOS circuit and the wiring 558 functions as a drain wiring. Further, the wiring 560 functions as a wiring electrically connecting the source wiring 517 and the source region of the switching TFT, and the wiring 561 functions to electrically connect the drain wiring 518 and the drain region of the switching TFT. Further, reference numeral 562 is a source wiring of a current control TFT (corresponds to a current supply line), and reference numeral 563 is a pixel electrode of a current control TFT.

Next, as shown in FIG. 7, an insulating film (hereinafter referred to as bank) 564 is formed for covering the end portion of the pixel electrode 563. The bank 564 may be formed by patterning an insulating film containing silicon with a thickness of 100 to 400 nm or an organic resin film. The bank 564 is formed to fill the gap between the pixels (between the pixel electrodes). Further, it has an object of the organic EL film of such as a light emitting layer formed next not to contact directly the end portion of the pixel electrode 563.

Note that, the bank 564 is an insulating film, therefore attention is needed for electrostatic disruption of elements at film formation. In this embodiment, carbon particles and metal particles are added in the insulating film to be the material for the bank 564 in order to decrease resistivity, and to suppress generation of static electricity. At this time, the amount of carbon particles and metal particles added may be regulated so that the resistivity becomes $1\times10^6$ to $1\times10^{12}$ $\Omega$m (preferably $1\times10^8$ to $1\times10^{10}$ $\Omega$m). Next, an EL layer 565 is formed by a vapor deposition method. Note that, in this embodiment, a laminate structure of a hole injecting layer and a light emitting layer is referred to as the EL layer. Namely, a laminate structure combining a hole injecting layer, a hole transporting layer, a hole preventing layer, an electron transporting layer, an electron injecting layer, and an electron preventing layer to a light emitting layer, is defined as the EL layer. Note that, these may be an organic material or an inorganic material, or may be a high polymer or a low polymer.

In this embodiment, first as an electron injecting layer, a lithium fluoride (LiF) film is formed with a thickness of 20 nm, and further an aluminum-quinoline complex (Alq$_3$) is formed with a thickness of 80 nm as a light emitting layer. Further, a dopant (typically a luminescence pigment) to become a light emission center to the light emitting layer may be added together by vapor deposition. As this dopant, an organic material emitting light through a triplet excitation may be used.

Next, when the EL layer 565 is formed, an anode 566 which has a large work function and is made from an oxide conductive film which is transparent to visible light is formed to a thickness of 300 nm. In this embodiment, an oxide conductive film with zinc oxide added with gallium oxide is formed by a vapor deposition method. Further, as other oxide conductive films, it is possible to use an oxide conductive film made of indium oxide, zinc oxide, tin oxide or a compound of a combination thereof. In this way, a pixel electrode (cathode) 563, and an EL element 567 containing an EL layer 565 and an anode 566 are formed.

Note that, after an anode 566 is formed, it is effective to provide a passivation film 568 for covering completely the EL element 567. A passivation film 568 is formed of an insulating film containing a carbon film, a silicon nitride film and a silicon nitride oxide film, and is used as a single layer or a lamination of the insulating film.

At this time, it is preferable that a film with good coverage is used as a passivation film, and it is effective to use a carbon film, especially a DLC (diamond-like carbon) film. The DLC film may be formed in a temperature of 100° C. or less, so that it may be formed easily above the EL layer 565 which has low heat resistivity. Further the DLC film has a high blocking effect against oxygen and can suppress oxidation of the EL layer 565. Therefore, a problem that the EL layer 565 oxidized while carrying out the sealing process to follow may be prevented.

Further, a sealing member 569 is provided on the passivation film 568 and the cover member 570 is adhered thereto. As a sealing member 569, an ultraviolet cured resin may be used, and it is effective to provide a substance having a moisture absorbent effect or a substance having an oxidation prevention effect. Further, in this embodiment, as a cover member 570, carbon films (preferably diamond-like carbon films) 570b and 570c are used for both sides of a plastic substrate (including plastic films) 570a.

In this way, an EL light-emitting device with a structure as shown in FIG. 7 is completed. Note that, after the bank 564 is formed, it is effective to perform the steps continuously until the formation of the passivation film 568 with a film formation device of a multi-chamber method (or an in-line method) without exposure to the air. Further, it is also possible to perform continuously the steps until the cover member 570 is adhered without exposure to the air.

In this way, n-channel TFTs 601 and 602, a switching TFT (n-channel TFT) 603 and a current control TFT (n-channel TFT) 604 are formed on the insulator 501 which has a plastic substrate as its main body. The photolithography step needed up to this manufacturing step is five times, which is less than in a normal active matrix EL light-emitting device.

Namely, the manufacturing processes of the TFT are greatly simplified, and improvement in yield and reduction in manufacturing cost may be realized. Further, a very flexible and light weighted EL light-emitting device may also be realized since the structure is such that the TFT and the EL element are surrounded by an insulator (including the cover member) which has a plastic substrate as a main body.

Further, as explained with reference to FIG. 6A, by providing an impurity region overlapping the first gate electrode through the gate insulating film, an n-channel TFT which has good resistance to deterioration due to the hot carrier effect may be formed. Therefore an EL light emitting device with a high reliability may be realized.

Figure 8:
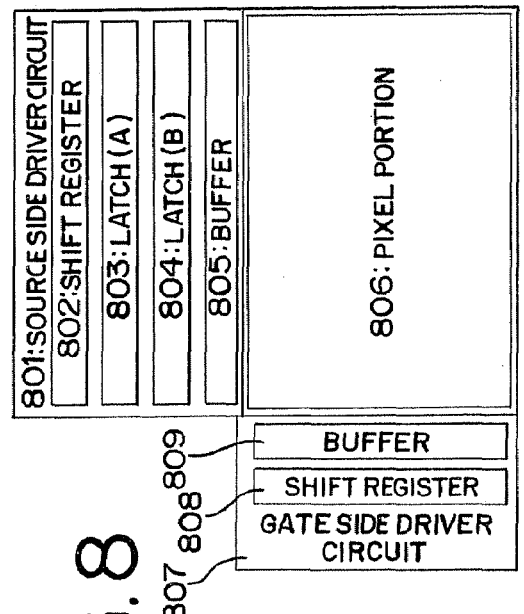
FIG. 8 is a diagram showing the configuration of circuit blocks of the EL light-emitting device.

Further, the circuit structural example of an EL light-emitting device of this embodiment is shown in FIG. 8. Note that, in this embodiment, a circuit structure for performing digital driving is shown, which comprises a source side driver circuit 801, a pixel portion 806 and a gate side driver circuit 807. Note that, throughout this specification, the driver circuit is a generic term including the source side driver circuit and the gate side driver circuit.

The source side driver circuit 801 includes a shift register 802, a latch (A) 803, a latch (B) 804 and a buffer 805. Note that in the case of an analog driving, a sampling circuit (also referred to as a transfer gate or an analog switch) may be provided in place of the latches (A) and (B). Note that, the gate side driver circuit 807 is provided with a shift register 808 and a buffer 809. Note that, the shift register shown in FIG. 4 may be used as the shift registers 802 and 808.

In this embodiment, the pixel portion 806 includes a plurality of pixels and EL elements are provided in the plurality of pixels. At this time, the cathode of the EL element is preferably electrically connected to a drain of a current control TFT.

The source side driver circuit 801 and the gate side driver circuit 807 are all formed of n-channel TFTs, and all the circuits are formed with the EEMOS circuit shown in FIG. 3A as the basic unit. As compared to the conventional CMOS circuit, the consumption power is increased somewhat but since the EL light-emitting device using the CMOS circuit as the driver circuit consumes about 95% of the power in its pixel portion, even if the consumption power of the driver circuit increases a little bit by using the NMOS circuit, it is not a major problem.

Note that, although not shown, a gate side driver circuit may also be provided on the opposite side of the gate side driver circuit 807 sandwiching the pixel portion 806. In this case, both gate side driver circuits share common gate wirings by the same structure so that the structure is such that even if one of the driver circuits breaks, gate signals may be sent from the other so that the pixel portion may be operated Note that, the above structure is realized by manufacturing TFTs following the manufacturing processes shown in FIGS. 5 to 7. Further, in this embodiment, although only the structure of the pixel portion and the driver circuit portion is shown, it is possible to form a logical circuit other than the driver circuit, such as a signal dividing circuit, a D/A converter circuit, an operational amplifier circuit, or a γ-correction circuit, on the same insulator if the manufacturing steps of the circuits are carried out in accordance with those of this embodiment. In addition, it is considered that a memory portion, a microprocessor, or the like can also be formed on the same insulator.

The EL light-emitting device of this embodiment after the process of sealing (filling) to protect the EL element is performed will be explained with reference to FIGS. 9A and 9B. Note that, the reference symbols used in FIGS. 5 to 8 will be referred to when necessary.

Shown in FIG. 9A is a top view of a state in which a sealing of the EL element has been performed. FIG. 9B is a cross sectional view of FIG. 9A cut along the line A-A'. The reference numeral 801 shown as a dotted line shows a source side driver circuit, reference numeral 806 shows a pixel portion, reference numeral 807 shows a gate side driver circuit. Further, reference numeral 901 shows a covering member, reference numeral 902 shows a first seal member, reference numeral 903 shows a second seal member, and a sealing member 907 is provided inside the first seal member 902 surrounded thereby.

Note that, reference numeral 904 shows a wiring for transmitting a signal input to the source side driver circuit 801 and the gate side driver circuit 807, which receives a video signal or a clock signal from an FPC (flexible printed circuit) 905 to be an external input terminal. Note that, here only an FPC is shown, but this FPC may be mounted with a printed wiring substrate (PWB), or may be in the form of a TCP (tape carrier package). Further, an IC may be mounted on the substrate by a COG (chip on glass).

The EL light-emitting device in this specification not only refers to the EL light-emitting device body, but also a state where FPC, TCP or PWB is mounted thereon.

Next, the cross sectional structure is described using FIG. 9B. On the insulator 501 are formed the pixel portion 806 and the gate side driver circuit 807. The pixel portion 806 is composed of a plurality of pixels each including the current control TFT 604 and the pixel electrode 563 that is electrically connected to the current control TFT 604. The gate side driver circuit 807 is formed using an NMOS circuit (see FIG. 3) in which the n-channel TFT 601 and the n-channel TFT 602 are combined.

The pixel electrode 563 functions as the cathode of the EL element. The banks 564 are formed at both ends of the pixel electrode 563 to thereby form the EL layer 565 and the anode 566 of the EL element on the pixel electrode 563. The anode 566 functions also as the common wiring for all pixels, and is electrically connected to the FPC 905 through the connection wiring 904. Further, the pixel portion 806 and the element included in the gate side driver circuit 807 are all covered by the anode 566 and the passivation film 567.

Further, a covering member 901 is adhered by a first seal member 902. Note that, a spacer made of a resin film may be provided to maintain the gap between the covering member 901 and the EL element. Then, the inside of the first seal member 902 is filled with a sealing member 907. Note that, as a first seal member 902 and a sealing member 907, an epoxy resin is preferably used. Further, the first seal member 902 is preferably of a material which does not transmit moisture or oxygen as much as possible. Further, a substance having a moisture absorbent effect or a substance having an oxidation prevention effect may be contained inside the sealing member 907.

The sealing member 907 provided for covering the EL element functions as an adhesive for adhering the covering member 901. Further, in this embodiment, as a material of a plastic substrate 901a constituting the covering member 901, a FRP (fiberglass-reinforced plastics), PVF (polyvinyl fluoride), a Mylar, a polyester, or an acrylic can be used. Next, carbon films (specifically a diamond-like carbon film) 901b and 901c as protective films are formed on both surfaces of the plastic substrate 901a with a thickness of 2 to 30 nm. Such a carbon film prevents penetration of oxygen and water as well as mechanically protects the surface of the plastic substrate 901a. Further, it is possible to adhere a polarizing plate (typically a round polarizing plate) on the outside carbon film 901b.

After the covering member 901 is adhere using the sealing member 907, a second seal member 903 is provided so as to cover a side surface (exposed surface) of the sealing member 907. The second seal member 903 and the first seal member 902 may be composed of the same material.

By sealing the EL element with such a structure in the sealing member 907, the EL element may be completely shielded from the outside, and penetration of substances such as moisture and oxygen that facilitate the deterioration of the EL layer due to oxidation thereof from the outside may be prevented. Accordingly, an EL light-emitting device with a high reliability may be obtained.

Embodiment 2

Embodiment 2 will be described with reference to FIGS. 10A and 10B with respect to an example of a structure for enclosing an EL element, which is different from that of the EL light-emitting device in Embodiment 1. Portions identical or corresponding to those shown in FIGS. 9A and 9B are indicated by the same reference characters. FIG. 10B is a cross-sectional view taken along the line A-A' of FIG. 10A.

In this embodiment, a plastic film 1001a having its both surfaces coated (covered) with carbon films (specifically, diamond-like carbon films) 1001b and 1001c formed as protective films is used as an insulating member 1001 on which TFTs and an EL element are formed. To form carbon films 1001b and 1001c on the both surfaces of the plastic film 1001a, a roll to roll method may be used.

By using a sealing material 907, a cover member 1002 is attached to the substrate with the EL element fabricated in accordance with Embodiment 1. A plastic film similar to the plastic film 1001a, i.e., a plastic film 1002a having its both surfaces coated with carbon films (specifically, diamond-like carbon films) 1002b and 1002c formed as protective films, is used as a cover member 1002. Further, end surfaces (edge portions) of the cover member 1002 are sealed with a second sealing material 1003.

Embodiment 3

Embodiment 3 will be described with respect to a case where in the light-emitting device in accordance with Embodiment 1, the n-channel TFT 601 is formed as a depletion-type TFT and each of the n-channel TFT 602, the switching TFT 603 and the current control TFT 604 is formed as an enhancement-type TFT.

The portions of the light-emitting device in the state shown in FIG. 5A are completed by the same process as that in Embodiment 1. A silicon oxide film 1101 having a thickness of 100 to 150 nm is then formed by sputtering, and a resist mask 1102 is formed on the region where the n-channel TFT 601 is formed. (FIG. 11A)

Next, an element belonging to the group 13 in the periodic table (boron in this embodiment) is added to the crystalline semiconductor film 503 by using the resist mask 1102. A region 1103 where boron has been added at a concentration of $1 \times 10^{15}$ to $5 \times 10^{17}$ atoms/cm$^3$ (typically, $1 \times 10^{16}$ to $1 \times 10^{17}$ atoms/cm$^3$) and a region 1104 where no boron has been added are thereby formed. (FIG. 11B)

Island-like semiconductor film 1105 to 1108 are thereafter formed through patterning of the crystalline semiconductor film. The semiconductor film 1105 is formed in the region 1104 where no boron was added while the semiconductor films 1106 to 1108 are formed in the region where boron was added. That is, the TFT having the semiconductor film 1105 as an active layer has no boron contained in the channel forming region or has a low boron concentration of $5 \times 10^{14}$ atoms/cm$^3$ or less while the TFTs having the semiconductor films 1106 to 1108 as active layers contain in the channel forming region boron at a concentration of $1 \times 10^{15}$ to $5 \times 10^{17}$ atoms/cm$^3$ (typically, $1 \times 10^{16}$ to $1 \times 10^{17}$ atoms/cm$^3$) (FIG. 11C).

Subsequently, the same process steps as those in Embodiment 1 may be performed. In this embodiment, the n-channel TFT formed by using the semiconductor film 1105 is a depletion-type TFT (i.e., a normally-on n-channel TFT), and the n-channel TFTs formed by using the semiconductor films 1106 to 1108 are enhancement-type TFTs (i.e., normally-off n-channel TFTs).

If this embodiment is carried out, the depletion-type TFT and the enhancement-type TFT formed by the above-described method can be combined to form the EDMOS circuit shown in FIG. 3B.

This embodiment has been described with respect to an example of the method in which a TFT is formed as an enhancement type by adding boron to the semiconductor film for a shift of the threshold voltage in the plus direction, the TFT including the channel forming region to which boron has been added. However, a TFT can also be formed as a depletion-type by adding an element belonging to the group 15 in the periodic table (typically, phosphorus or arsenic) for a shift of the threshold voltage in the minus direction, the TFT including the channel forming region to which the element belonging to the group 15 in the periodic table has been added.

This embodiment can be carried out by being combined with Embodiment 1 or Embodiment 2.

Embodiment 4

Embodiment 4 will be described with reference to FIGS. 12 through 14 with respect to a case where all TFTs in a source-side driver circuit and a gate-side driver circuit are formed as E-type NTFTs. According to the present invention, a decoder using only n-channel TFTs is used instead of a shift register.

Figure 12:
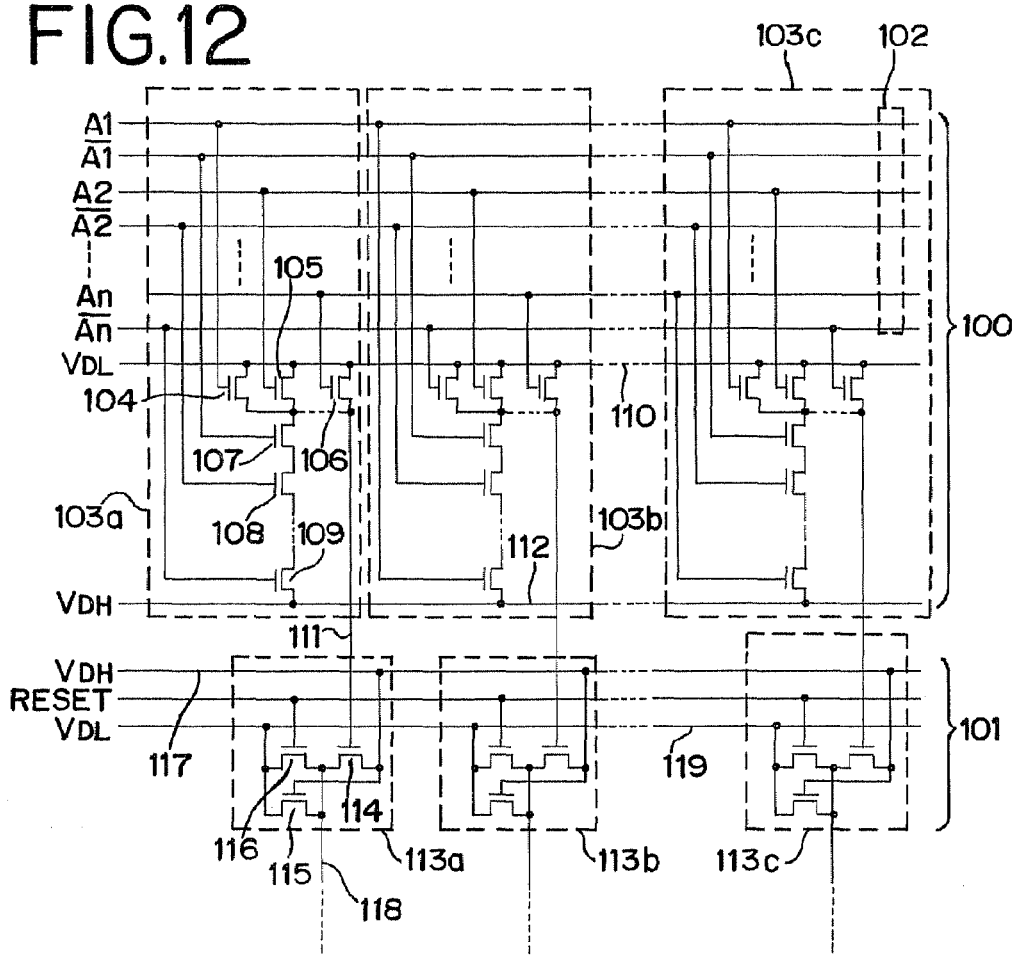
FIG. 12 is a diagram showing the configuration of a gate-side driver circuit.
Figure 13:
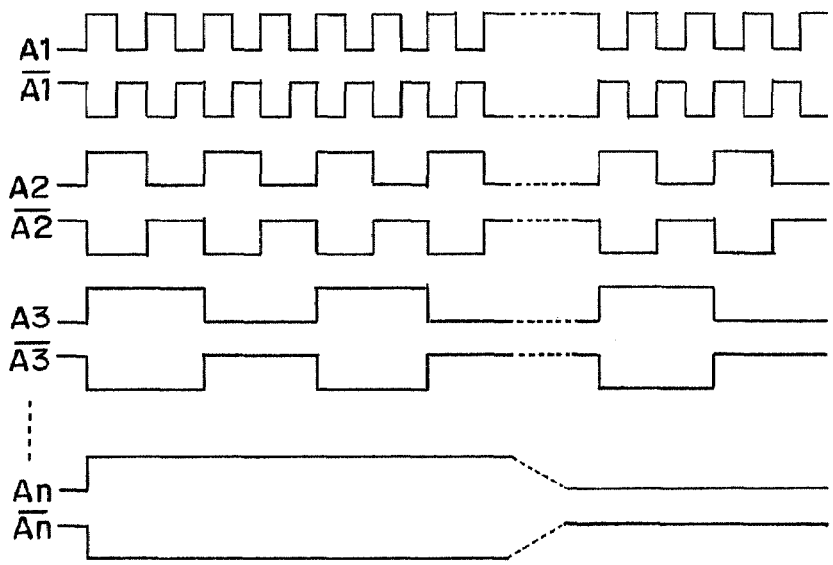
FIG. 13 is a diagram forming a timing chart of decoder input signals.

FIG. 12 shows an example of a gate-side driver circuit. Referring to FIG. 12, a section 100 is a decoder in the gate-side driver circuit, and a section 101 is a buffer section of the gate-side driver circuit. "Buffer section" denotes a portion in which a plurality of buffers (buffer amplifiers) are integrated. Also, "buffer" denotes a circuit for driving while preventing a subsequent stage from influencing a preceding stage.

The gate-side decoder 100 will first be described. The decoder 100 has input signal lines (hereinafter referred to as "selecting lines") 102. In FIG. 12 are illustrated the selecting lines for supplying a signal A1 and a signal A1-bar (of the opposite polarity relative to that of the signal A1), a signal A2 and a signal A2-bar (of the opposite polarity relative to that of the signal A2), . . . An and An-bar (of the opposite polarity relative to that of the signal An). That is, it may be understood that 2n selecting lines are arranged.

The number of selecting lines is determined according to the number of gate wiring lines to which signals are supplied from the gate-side driver circuit. For example, if a pixel portion for video graphics array (VGA) display is provided, the number of gate wiring lines is 480 and a total of 18 selecting lines for 9 bits (corresponding to n=9) are required. The selecting lines 102 transmit signals shown in the timing chart of FIG. 13. As shown in FIG. 13, according that the frequency of A1 is 1, the frequency of A2 is $2^{-1}$, the frequency of A3 is $2^{-2}$, and the frequency of An is $2^{-(n-1)}$.

A portion 103a is a first-stage NAND circuit (also called a NAND cell), a portion 103b is a second-stage NAND circuit, and a portion 103c is an nth-stage NAND circuit. The requisite number of NAND circuits corresponds to the number of gate wiring lines, i.e., n NAND circuits in this description. That is, in the present invention, the decoder 100 is formed by a plurality of NAND circuits.

N-channel TFTs 104 to 109 are combined to form each of the NAND circuits 103a to 103c. Actually, 2n TFTs are used to form the NAND circuit 103. The gate of each of the n-channel TFTs 104 to 109 is connected to one of the selecting lines 102 (A1, A1-bar, A2, A2-bar, . . . An, An-bar).

In the NAND circuit 103a, the n-channel TFTs 104 to 106 each having the gate connected to one of A1, A2, . . . , An (called positive selecting lines) are connected in parallel with each other, have a common source connection to a negative power supply line ($V_{DL}$) 110, and have a common drain connection to an output line 71. The n-channel TFTs 107 to 109 each having the gate connected to one of A1-bar, A2-bar, . . . An-bar (called negative selecting lines) are connected in series. The source of the n-channel TFT 109 at the circuit end is connected to a positive power supply line ($V_{DH}$)

112 while the drain of the n-channel TFT 107 at the other circuit end is connected to the output line 111.

In the present invention, as described above, each NAND circuit includes n n-channel TFTs connected in series and n n-channel TFTs connected in parallel. However, the n NAND circuits 103a to 103c differ from each other in the combinations of the n-channel TFTs and the selecting lines. That is, only one output line 111 is selected at a time. The selecting lines are supplied with signals such that the output lines are selected successively from the end of the array of the NAND circuits.

The buffer section 101 is formed by a plurality of buffers 113a to 113c corresponding to the NAND circuits 103a to 103c. However, the buffers 113a to 113c may be identical in configuration.

Each of the buffers 113a to 113c is formed by using n-channel TFTs 114 to 116. The output line 111 from the decoder is connected as an input line to the gate of the n-channel TFT 114 (first n-channel TFT). The n-channel TFT 114 has its source connected to a positive power supply line ($V_{DH}$) 117 and has its drain connected to a gate wiring 118 led to the pixel portion. The n-channel TFT 115 (second n-channel TFT) has its gate connected to the positive power supply line ($V_{DH}$) 117, its source to a negative power supply line ($V_{DL}$) 119, and its drain to the gate wiring 118, and is always on.

That is, in the present invention, each of the buffers 113a to 113c includes the first n-channel TFT (n-channel TFT 114) and the second n-channel TFT (n-channel TFT 115) connected in series with the first n-channel TFT and has its gate connected to the drain of the first n-channel TFT.

An n-channel TFT 116 (third n-channel TFT) has its gate connected to a reset signal line (Reset), its source to the negative power supply line ($V_{DL}$) 119, and its drain to the gate wiring 118. The negative power supply line ($V_{DL}$) 119 may be provided as a ground power supply line (GND).

In the thus-formed buffer, the channel width of the n-channel TFT 115, represented by W1, and the channel width of the n-channel TFT 114, represented by W2, are in a relationship W1<W2. The channel width is a size of the channel forming region in the direction perpendicular to the channel length.

The buffer 113a operates as described below. When a negative voltage is being applied to the output line 111, the n-channel TFT 114 is off (in such a state that no channel is formed). On the other hand, the n-channel TFT 115 is always on (in such a state that a channel is formed), so that the voltage of the negative power supply line 119 is applied to the gate wiring line 118.

When a positive voltage is applied to the output line 111, the n-channel TFT 114 is turned on. At this time, since the channel width of the n-channel TFT 114 is larger than that of the n-channel TFT 115, the potential of the gate wiring line 118 is pulled by the output of the n-channel TFT 114, so that the voltage of the positive power supply line 117 is applied to the gate wiring line 118.

Thus, through the gate wiring line 118, a positive voltage (such that the n-channel TFT used as the pixel switching element is turned on) is output when a positive voltage is applied to the output line 111, and a negative voltage (such that the n-channel TFT used as the pixel switching element is turned off) is always output when a negative voltage is applied to the output line 111.

The n-channel TFT 116 is used as a reset switch for forcibly reducing, to a negative voltage, the potential of the gate wiring line 118 to which a positive voltage is applied. That is, at the end of the period for selection of the gate wiring line 118, a reset signal is input to apply a negative voltage to the gate wiring line 118. However, the n-channel TFT 116 may be omitted.

The gate wiring lines are successively selected by the gate-side driver circuit operating as described above. FIG. 14 shows the configuration of the source-side driver circuit. The source-side driver circuit shown in FIG. 14 includes a decoder 121, a latch 122, and a buffer section 123. The configurations of the decoder 121 and the buffer section 123 are the same as those in the gate-side driver circuit, and the description for them will not be repeated.

Figure 14:
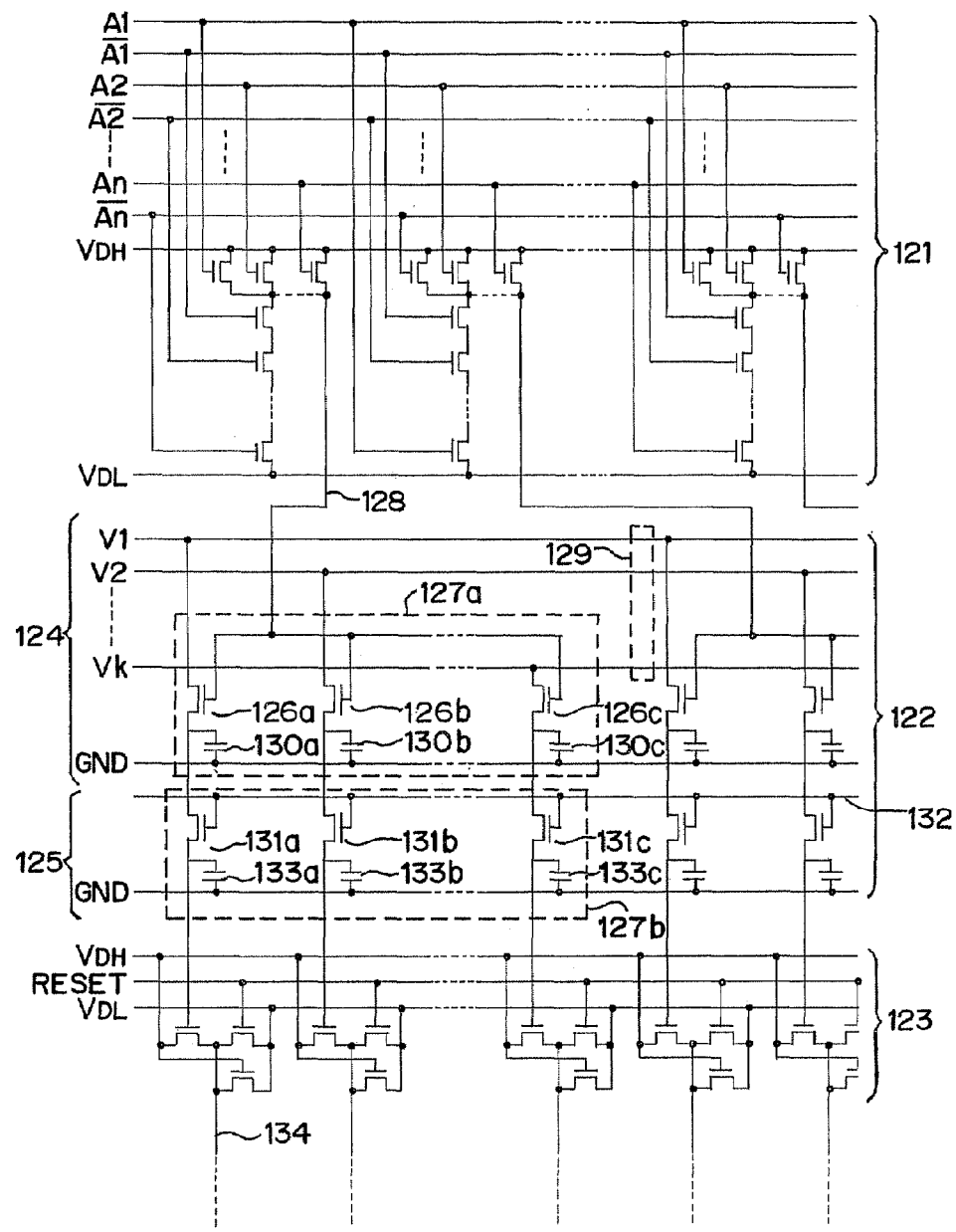
FIG. 14 is a diagram showing the configuration of a source-side driver circuit.

In the source-side driver circuit shown in FIG. 14, the latch 122 is formed of a first-stage latch 124 and a second-stage latch 125. Each of the first-stage latch 124 and the second-stage latch 125 has a plurality of unit sections 127a or 127b each formed by m n-channel TFTs 126a to 126c. An output line 128 from the decoder 121 is connected as an input line to the gate of each of the m n-channel TFTs 126a to 126c constituting the unit section 127a. The letter m represents an arbitrary integer.

For example, in the case of VGA display, the number of source wiring lines is 640. If m=1, 640 NAND circuits and 20 selecting lines (corresponding to 10 bits) are required. If m=8, the necessary number of NAND circuits is 80 and the necessary number of selecting lines is 14 (corresponding to 7 bits). That is, if the number of source wiring lines is M, the necessary number of NAND circuits is (M/m).

The sources of the n-channel TFTs 126a to 126c are respectively connected to video signal lines (V1, V2, ... Vk) 129. That is, when a positive voltage is applied to the output line 128, the n-channel TFTs 126a to 126c are simultaneously turned on to take in corresponding video signals. The video signals thus taken in are held in capacitors 130a to 130c connected to the n-channel TFTs 126a to 126c.

The second-stage latch 125 has a plurality of unit sections 127b each formed by m n-channel TFTs 131a to 131c. The gates of all the n-channel TFTs 131a to 131c are connected to a latch signal line 132. When a negative voltage is applied to the latch signal line 132, the n-channel TFTs 131a to 131c are simultaneously turned on.

The signals held by the capacitors 130a to 130c are then held by capacitors 133a to 133c respectively connected to the n-channel TFTs 131a to 131c and are simultaneously output to the buffer 123. Then, the signals are output to source wiring lines 134 through the buffer, as described above with reference to FIG. 13. The source wiring lines are successively selected by the source-side driver circuit operating as described above.

Thus, the gate-side driver circuit and the source-side driver circuit are formed only by n-channel TFTs, so that all the TFTs for pixel portion and the driver circuits can be formed as n-channel TFTs. The present invention can also be applied to a light-emitting device in which one of the source-side driver circuit and the gate-side driver circuit is provided as an IC externally mounted (typically, in the form of a TCP or in a COG manner).

Embodiment 5

Embodiment 5 will be described with reference to FIGS. 15 and 16 with respect to a case where each of the source-side driver circuit and the gate-side driver circuit is formed by combining E-type NTFTs and D-type NTFTs.

Figure 15:
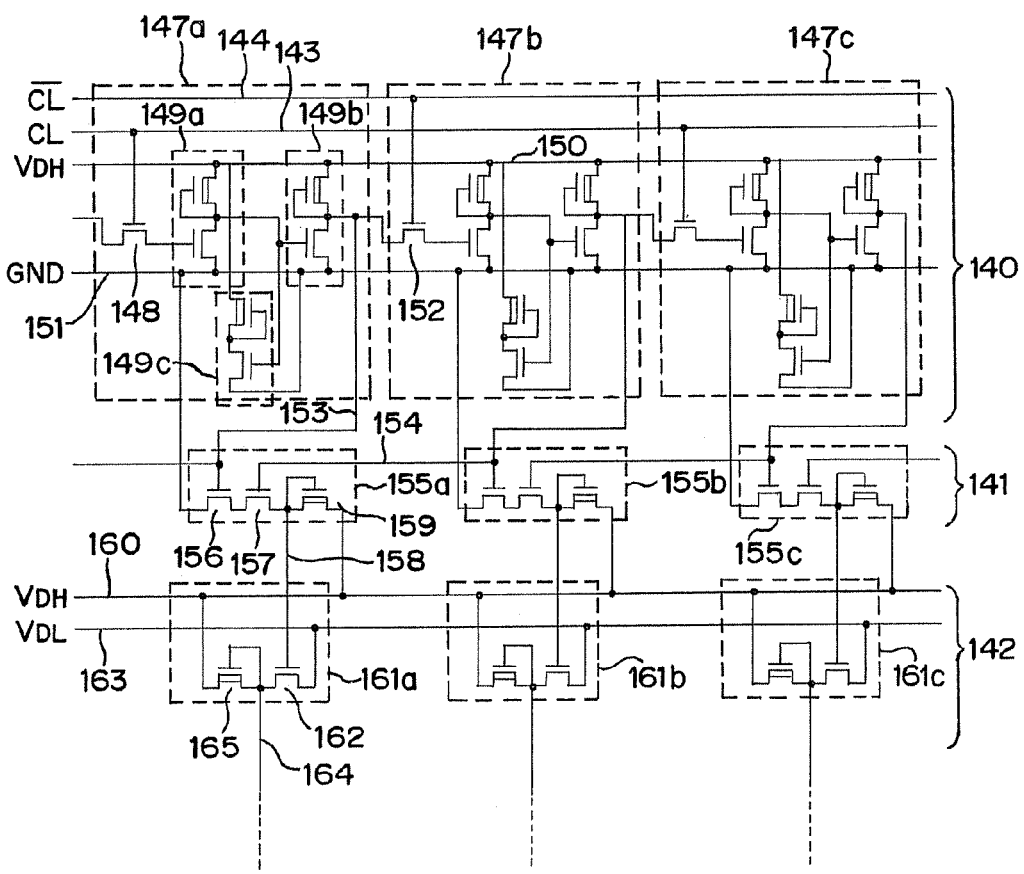
FIG. 15 is a diagram showing the configuration of a gate-side driver circuit.

FIG. 15 shows an example of the gate-side driver circuit. Referring to FIG. 15, there are provided a shift register 140, a NAND circuit section 141, and a buffer section 142.

The shift register 140 is a concrete example of the shift register shown in FIG. 4. A clock signal line 143, a clock signal line 144 for supplying a clock of the opposite polarity, a positive power supply line ($V_{DH}$) 150, and a ground power supply line (GND) 151 are provided. With respect to this embodiment, three flip-flop circuits 147a to 147c are illustrated as basic units constituting the shift register 140. Actually, a plurality of flip-flop circuits more than three are connected in series to form the shift register 140.

The flip-flop circuit 147a in this embodiment is configured in correspondence with the flip-flop circuit 400 shown in FIG. 4, and the flip-flop circuit 147b is configured in correspondence with the flip-flop circuit 401. Each of the flip-flop circuits 147a to 147c is formed by E-type NTFTs and D-type NTFTs.

In the flip-flop circuit 147a, an E-type NTFT 148 has its gate connected to the clock signal line 143, and EDMOS circuits 149a to 149c of the construction shown in FIG. 3B are formed in a configuration such as shown in FIG. 4. A line 150 is a positive power supply line ($V_{DH}$) and a line 151 is a ground power supply line (GND).

The flip-flop circuit 147b has the same configuration as the flip-flop circuit 147a except that the gate of an E-type NTFT 152 is connected to the clock signal line 144 of the opposite polarity.

An output line 153 of the flip-flop circuit 147a and an output line 154 of the flip-flop circuit 147b are connected to a NAND circuit 155a. Three NAND circuits 155a to 155c in the NAND circuit section 141 are illustrated. Actually, the NAND circuit section 141 is formed of a plurality of NAND circuits more than three. One NAND circuit is provided in correspondence with two flip-flop circuits. Each of the NAND circuits 155a to 155c is formed by E-type NTFTs 156 and 157 and a D-type NTFT 159.

In the NAND circuit 155a, the E-type NTFT 156 has its gate connected to the output line 153, its source to the ground power supply line 151, and its drain to the E-type NTFT 157. The E-type NTFT 157 has its gate connected to the output line 154, its source to the drain of the E-type NTFT 156, and its drain to an output line 158. The D-type NTFT 159 has its source connected to a positive power supply line 160 and its gate and drain to the output line 158.

The output line 158 from the NAND circuit 155a is connected to an EDMOS circuit (which may also be called an inverter circuit) 161a. Three EDMOS circuits 161a to 161c in the buffer section 142 are illustrated. Actually, the buffer section 142 is formed of a plurality of EDMOS circuits more than three.

In the EDMOS circuit 161a, an E-type NTFT 162 has its gate connected to the output line 158, its source to a negative power supply line ($V_{DL}$) 163, and its drain to an output line 164 (corresponding to the gate wiring of the pixel portion), and a D-type NTFT 165 has its gate and drain connected to the output line 164 and its source to the positive power supply line 160.

Figure 16:
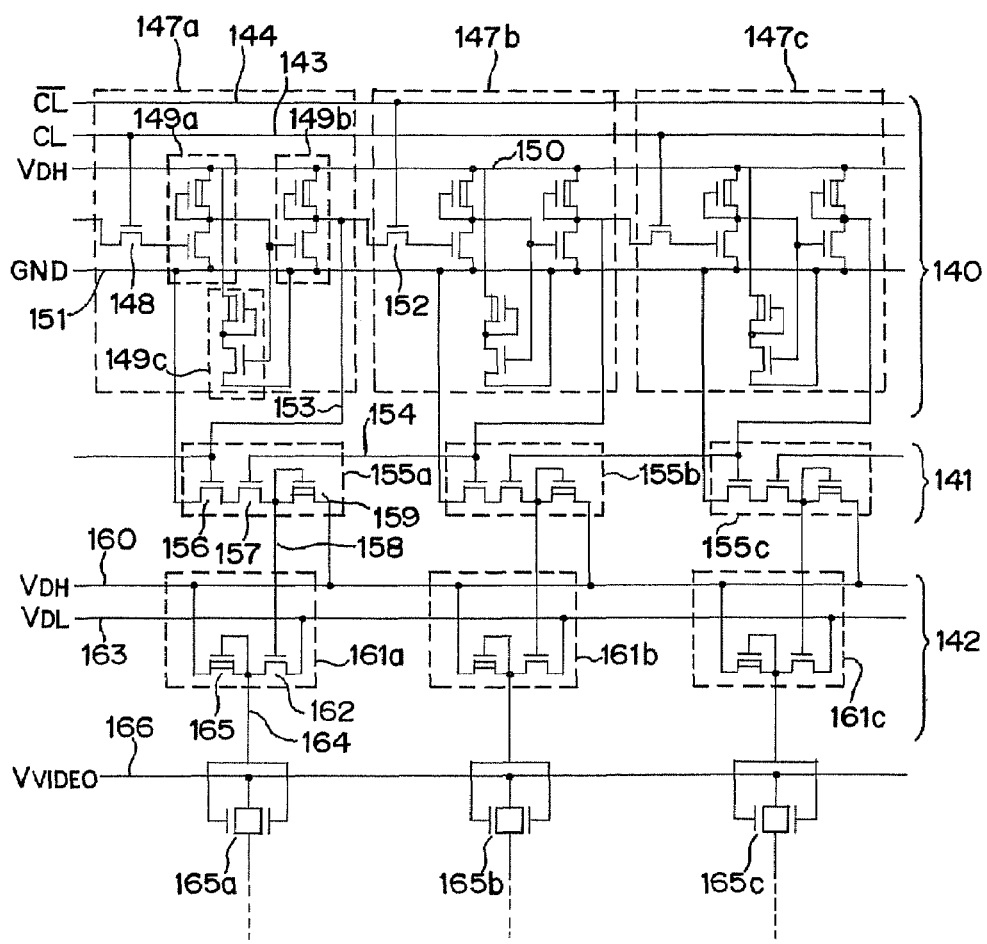
FIG. 16 is a diagram showing the configuration of a source-side driver circuit.

FIG. 16 shows the configuration of the source-side driver circuit. The source-side driver circuit shown in FIG. 16 is formed by adding transfer gates 165a to 165c to the gate-side driver circuit shown in FIG. 15, and the same circuits as those forming the shift register 140, the NAND circuit section 141 and the buffer section 142 can be used. This configuration is intended for analog driving.

In this embodiment, two E-type NTFTs are provided in parallel in the transfer gates 165a to 165c. However, this is a redundant design and is a means for improving the current supply capacity. A line 166 is a video signal line.

In this embodiment, if digital driving is performed, the latch 122 and the buffer section 123 shown in FIG. 14 may be provided under the NAND circuit section 141. Conversely, to adapt the source-side driver circuit shown in FIG. 14 to analog driving, the latch 122 may be removed and the transfer gates shown in FIG. 16 may be added as a stage following the buffer section 123.

As described above, the gate-side driver circuit and the source-side driver circuit are formed only by n-channel TFTs, so that all the TFTs for pixel portion and the driver circuits can be formed as n-channel TFTs. The present invention can also be applied to a light-emitting device in which one of the source-side driver circuit and the gate-side driver circuit is provided as an IC externally mounted.

Embodiment 6

Figure 17A:
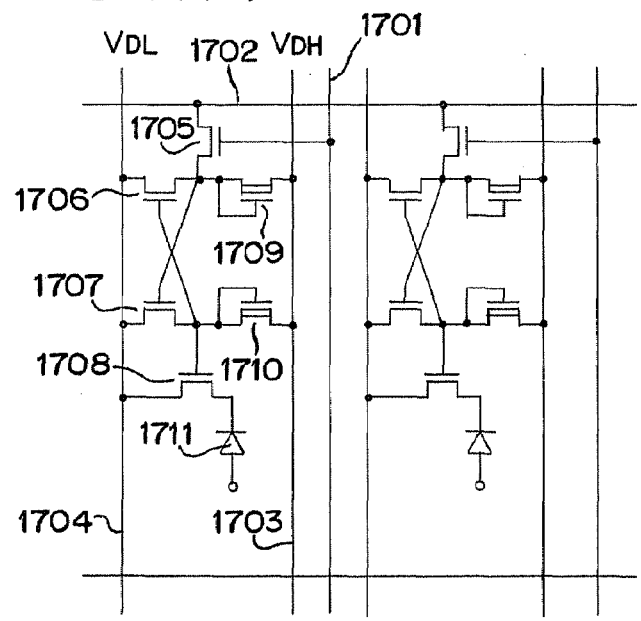
FIGS. 17A and 17B are diagrams showing examples of the configuration of the pixel portion.
Figure 17B:
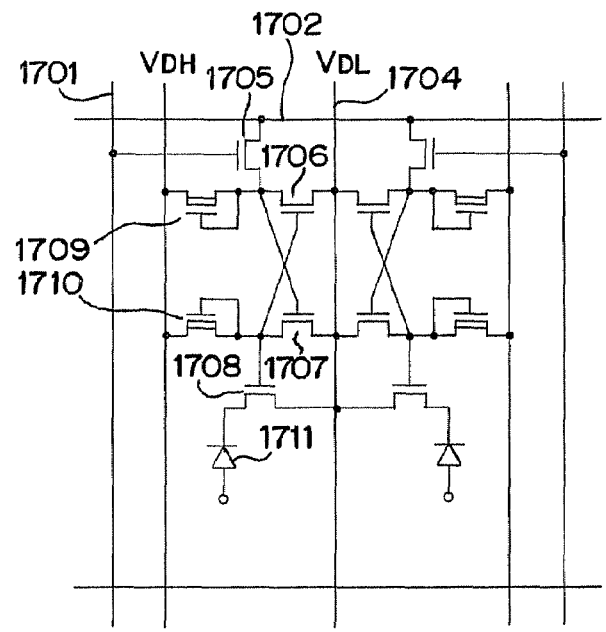
Figure 18A:
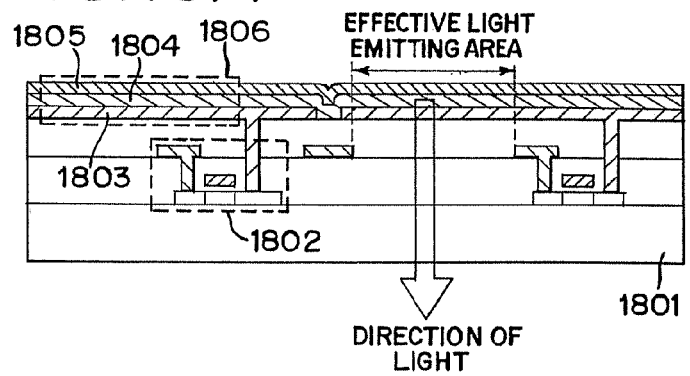
FIGS. 18A and 18B are diagrams showing examples of the structure of conventional EL light-emitting devices.
Figure 18B:
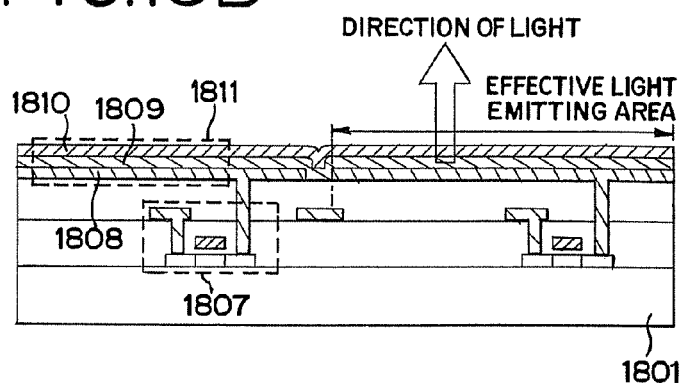
Figure 19A:
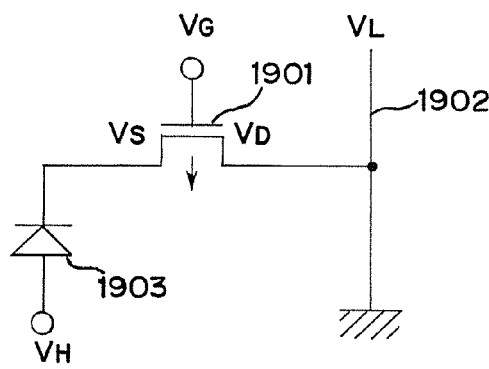
FIGS. 19A and 19B are diagrams showing examples of the configuration of a TFT in a pixel-forming segment.
Figure 19B:
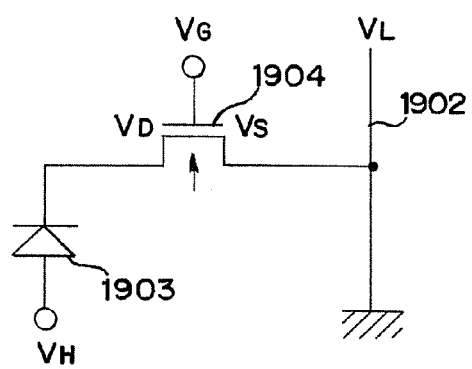

FIGS. 17A and 17B show examples of the construction of each pixel-forming segment in the EL light-emitting device of the present invention. Referring to FIG. 17A, a line 1701 is a gate wiring line, a line 1702 is a source wiring line, a line 1703 is a positive power supply line, and a line 1704 is a negative power supply line (which may be a ground power supply line). Components 1705 to 1708 are E-type NTFTs, and components 1709 and 1710 are D-type NTFTs. An EL element indicated by 1711 is connected to the E-type NTFT 1708.

In the pixel-forming structure of this embodiment, six TFTs are provided in one pixel-forming segment to form a static random access memory (SRAM). More specifically, a plurality of E-type NTFTs and a plurality of D-type NTFTs form an SRAM. Thus, in carrying out the present invention, the number of TFTs included in one pixel-forming segment is not particularly limited.

In the pixel-forming structure of this embodiment, the E-type NTFT 1705 functions as a switching TFT while the E-type NTFT 1708 functions as a current control TFT. Also, the inverter circuit constituted by the E-type NTFT 1706 and the D-type NTFT 1709 and the inverter circuit constituted by the E-type NTFT 1707 and the D-type NTFT 1710 are combined to perform a memory function.

FIG. 17B shows an example of the pixel-forming structure in which adjacent two pixels shown in FIG. 17A have a common negative power supply line and are symmetrically arranged. In this manner, the number of wiring lines in each pixel-forming segment can be reduced, whereby the pixel density is increased.

The configuration of this embodiment may be combined with any of Embodiments 1 to 5 to carry out the present invention.

Embodiment 7

The source-side driver circuit and the gate-side driver circuit in Embodiment 4 or 5 can also be used in a liquid crystal display device. That is, any of the EEMOS circuit shown in FIG. 3A, the EDMOS circuit shown in FIG. 3B, the shift register shown in FIG. 4, the gate-side driver circuit shown in FIG. 13, and the source-side driver circuit shown in FIG. 14 can be used to form a driver circuit for the liquid crystal display device.

The liquid crystal display device may be a liquid crystal module in which a flexible printed circuit (FPC) is attached to a liquid crystal panel. The liquid crystal module comprises a construction in which a printed wiring board (PWB) is provided as a member to which the FPC is connected. The liquid crystal module also comprises a tape carrier package (TCP) in which an integrated circuit (IC) is connected to an FPC. An IC may be mounted on the substrate in a chip on glass (COG) manner.

Embodiment 8

In carrying out the present invention, bottom-gate TFTs (typically, inverted stagger TFTs) may be used as well as top-gate TFTs (typically, planar TFTs). Also, MOSFETs formed on a semiconductor substrate (typically, a silicon substrate) may be used.

The configuration of this embodiment may be combined with any of Embodiments 1 to 7 to carry out the present invention.

Embodiment 9

The light-emitting device or the liquid crystal display device formed by implementing this invention may be used as a display portion of various electrical appliances. As electrical appliances of this invention, there are such as an image playback device with a video camera, a digital camera, a goggle type display (head mounted display), a car navigation system, a car audio, a note type personal computer, a game apparatus, a portable information terminal (such as a mobile computer, a portable telephone, a portable game apparatus or an electronic book), and a recording medium. Specific examples of the electronic equipment are shown in FIGS. 20 and 21.

Figure 20A:
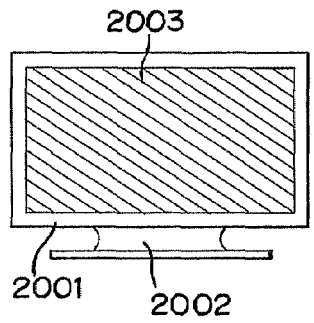
FIGS. 20A through 20F are diagrams showing examples of electric appliances.

FIG. 20A shows an EL display and includes a casing 2001, a supporting base 2002 and a display portion 2003. The light-emitting device and the liquid crystal display device of this invention may be used for the display portion 2003. When using the EL light-emitting device in the display portion 2003, since it is a self-light emitting type backlight is not necessary and the display portion may be made thin.

Figure 20B:
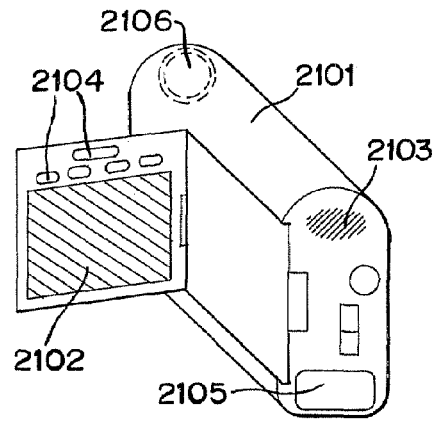

FIG. 20B shows a video camera, which contains a main body 2101, a display portion 2102, a sound input portion 2103, operation switches 2104, a battery 2105, and an image receiving portion 2106. The light-emitting device and the liquid crystal display device of this invention can be applied to the display portion 2102.

Figure 20C:
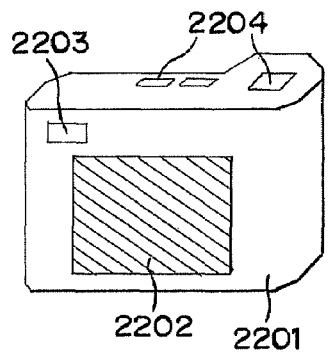

FIG. 20C shows a digital camera, which contains a main body 2201, a display portion 2202, a eye contact portion 2203, and operation switches 2204. The light emitting-device and the liquid crystal display device of this invention can be applied to the display portion 2102.

Figure 20D:
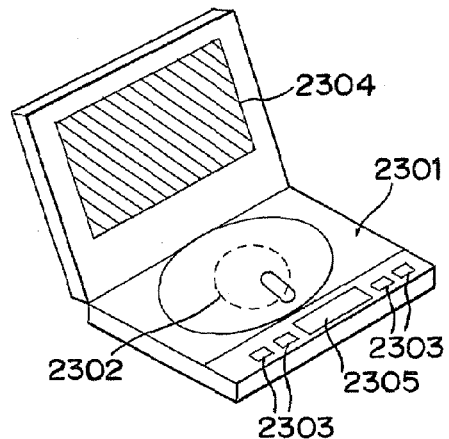

FIG. 20D shows an image playback device equipped with a recording medium (specifically, a DVD playback device), which contains a main body 2301, a recording medium (such as a CD, LD or DVD) 2302, operation switches 2303, a display portion (a) 2304, a display portion (b) 2305 and the like. The display portion (a) is mainly used for displaying image information. The display portion (b) 2305 is mainly used for displaying character information. The light-emitting device and the liquid crystal display device of this invention can be applied to the display portion (a) and the display portion (b). Note that, the image playback device equipped with the recording medium includes devices such as CD playback device, and game machines.

Figure 20E:
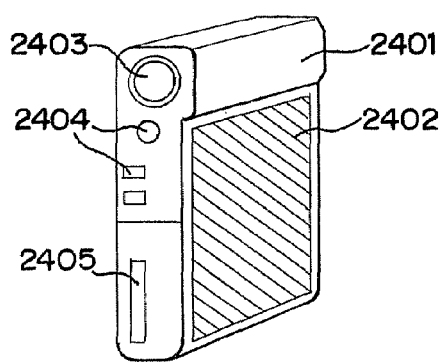

FIG. 20E shows a portable (mobile) computer, which contains a main body 2401, a display portion 2402, an image receiving portion 2403, operation switches 2404 and a memory slot 2405. The light-emitting device and the liquid crystal display device of this invention can be applied to the display portion 2402. This portable computer may record information to a recording medium that has accumulated flash memory or involatile memory, and playback such information.

Figure 20F:
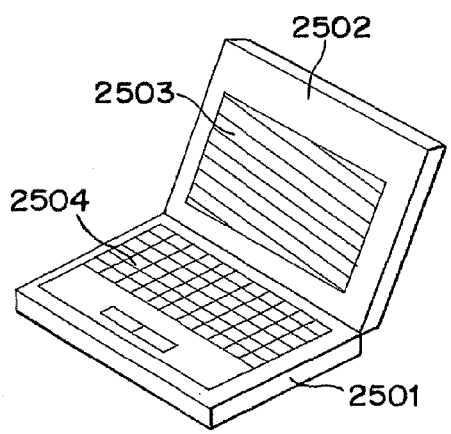

FIG. 20F shows a personal computer, which contains a main body 2501, a casing 2502, a display portion 2503, and a keyboard 2504. The light-emitting device and the liquid crystal display device of this invention can be applied to the display portion 2503.

The above electronic appliances more often display information sent through electron communication circuits such as the internet or the CATV (cable television), and especially image information display is increasing. When using the EL light-emitting device in the display portion, since the response speed of the EL light-emitting device is extremely fast, it becomes possible to display pictures without delay.

Further, since the light emitting portion of the EL light-emitting device consumes power, it is preferable to display information so that the light emitting portion is as small as possible. Therefore, when using the EL light-emitting device in the portable information terminal, especially in the display portion where character information is mainly shown in a cellular phone or a car audio, it is preferable to drive so that the character information is formed of a light emitting portion with the non-light emitting portion as a background.

Figure 21A:
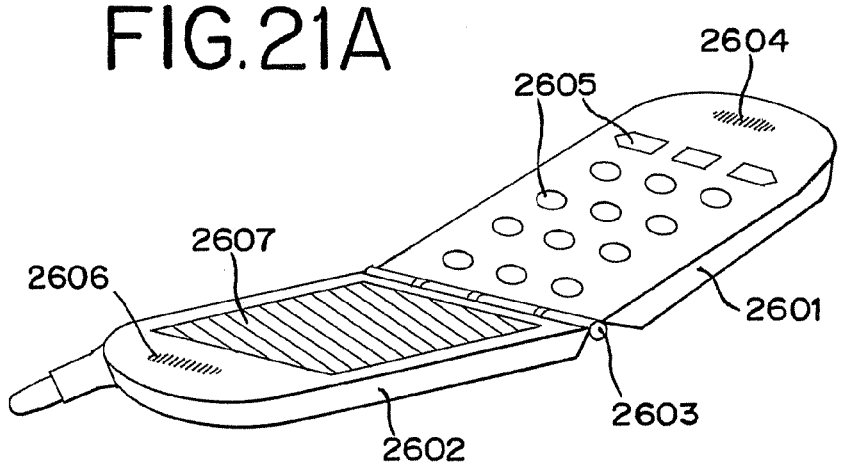
FIGS. 21A and 21B are diagrams showing examples of electric appliances.

Here, FIG. 21A shows a portable telephone, and reference numeral 2601 shows a portion (operation portion) which performs key operation, and reference numeral 2602 shows a portion which performs information display (information display portion), and the operation portion 2601 and the information display portion 2602 are connected by the connecting portion 2603. Further, the operation portion 2601 is provided with a sound input portion 2604, operation switches 2605, and the information display potion 2602 is provided with a sound output portion 2606, a display portion 2607.

The light-emitting device and the liquid crystal display portion of this invention may be used as the display portion 2607. Note that, when using the EL light-emitting device to the display portion 2607, the consumption power of the portable telephone may be suppressed by displaying white letters in the background of the black color.

In the case of the portable telephone shown in FIG. 21A, the EL light-emitting device used in the display portion 2604 is incorporated with a sensor (a NMOS sensor), and may be used as an authentication system terminal for authenticating the user by reading the fingerprints or the hand of the user. Further, light emission may be performed by taking into consideration the brightness (illumination) of outside and making information display at a contrast that is already set.

Further, the low power consumption may be attained by decreasing the brightness when using the operating switch 2605 and increasing the brightness when the use of the operation switch is finished. Further, the brightness of the display portion 2604 is increased when a call is received, and low power consumption is attained by decreasing the brightness during a telephone conversation. Further, when using the telephone continuously, by making it have a function so that display is turned off by time control unless it is reset, low power consumption is realized. It should be noted that this control may be operated by hand.

Figure 21B:
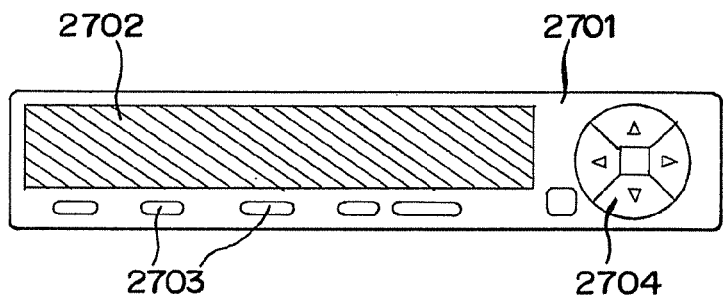

Further, FIG. 21B shows an audio, which contains a casing 2701, a display portion 2702, and operation switches 2703 and 2704. The light-emitting device and the liquid crystal display device of this invention can be applied to the display portion 2502. Further, in this embodiment, a car mounted audio (car audio) is shown, but it may be used in a fixed type audio (audio component). Note that, when using an EL light-emitting device in the display portion 2704, by displaying white characters in a black background, power consumption may be suppressed.

Further, electrical equipment shown above are incorporated with a light sensor in the light-emitting device and the liquid crystal display device which are used in the display portion, and it is possible to provide means to detect the brightness of the environment of use. When using the EL light-emitting device in the display portion, it is may have a function that modulates the light-emission brightness according to the brightness of the environment of use. Specifically, this is implemented by providing an image sensor (surface shape, linear or a dotted sensor) formed by a NMOS circuit on the EL light-emitting device using the display portion, and providing a CCD (charge coupled device) on the main body or the casing. The user may recognize the image or the character information without trouble if a brightness of a contrast ratio of 100 to 150 may be maintained as compared to the brightness of the environment of use. Namely, in the case the environment of use is dark, it is possible to suppress the consumption power by suppressing the brightness of the image.

As in the above, the applicable range of this invention is extremely wide, and may be used for various electrical equipment. Further, the electrical equipment of this embodiment may use the light-emitting device and the liquid crystal display device containing any of the structures of Embodiments 1 to 5.

It is possible to manufacture a light-emitting device having a high light extraction efficiency at a low cost and at a high yield by carrying out the present invention. Thus, a light-emitting device which is inexpensive but capable of displaying a bright image can be provided. Also, a low-priced electric appliance having a display portion capable of displaying a bright image can be provided by using in the display portion the low-priced light-emitting device capable of displaying a bright image.

What is claimed is:

1. A light-emitting device comprising:
    a display portion comprising a plurality of pixels formed over a substrate; and
    a driver circuit formed over said substrate,
    wherein said driver circuit comprises a shift register containing a plurality of flip-flop circuits comprising enhancement-type n-channel thin film transistors and depletion-type n-channel thin film transistors,
    wherein all semiconductor elements in said display portion and said driver circuit are n-channel type semiconductor elements, and
    wherein each of said plurality of pixels comprises a light-emitting element.

2. A light-emitting device according to claim 1, wherein said substrate is a plastic substrate covered with a protective film.

3. A light-emitting device according to claim 1, wherein said light-emitting device is incorporated in one selected from the group consisting of an EL display, an image playback device, a personal computer, a video camera, a digital camera, a mobile computer, a mobile telephone, and an audio.

4. A light-emitting device according to claim 1, wherein each of said plurality of flip-flop circuits comprises an enhancement-type n-channel thin film transistor and two circuits.

5. A light-emitting device according to claim 4, wherein one of the circuits is an EEMOS circuit.

6. A light-emitting device according to claim 4, wherein one of the circuits is an EDMOS circuit.

7. A light-emitting device according to claim 4, wherein each of said plurality of flip-flop circuits further comprises an inverter circuit.

8. A light-emitting device according to claim 4, wherein said plurality of flip-flop circuits are connected in series.

9. A light-emitting device according to claim 1, wherein one of the enhancement-type n-channel thin film transistors is electrically connected with one of the depletion-type n-channel thin film transistors.

10. A light-emitting device according to claim 1, wherein a semiconductor element in the display portion has at least two channel forming regions.

11. A light-emitting device according to claim 1, wherein each of said plurality of pixels comprises two semiconductor elements a switching element, a current control element for controlling an amount of current to the light-emitting element, and a capacitor.

12. A light-emitting device according to claim 1, wherein the semiconductor element is an inverted stagger thin film transistor including a microcrystalline semiconductor film.

13. A light-emitting device comprising:
    a display portion comprising a plurality of pixels formed over a substrate; and
    a driver circuit formed over said substrate,
    wherein said driver circuit comprises a shift register containing a plurality of flip-flop circuits comprising enhancement-type n-channel thin film transistors and depletion-type n-channel thin film transistors, and comprises a plurality of NAND circuits each comprising first and second enhancement-type n-channel thin film transistors and a depletion-type n-channel thin film transistor,
    wherein a gate electrode of first enhancement-type n-channel thin film transistor is connected to a first output line,
    wherein a source electrode of first enhancement-type n-channel thin film transistor is connected to a ground power supply line,
    wherein a drain electrode of first enhancement-type n-channel thin film transistor is connected to second enhancement-type n-channel thin film transistor,
    wherein all semiconductor elements in said display portion and said driver circuit are n-channel type semiconductor elements, and
    wherein each of said plurality of pixels comprises a light-emitting element.

14. A light-emitting device according to claim 13, wherein said substrate is a plastic substrate covered with a protective film.

15. A light-emitting device according to claim 13, wherein said light-emitting device is incorporated in one selected from the group consisting of an EL display, an image playback device, a personal computer, a video camera, a digital camera, a mobile computer, a mobile telephone, and an audio.

16. A light-emitting device according to claim 13, wherein a semiconductor element in the display portion has at least two channel forming regions.

17. A light-emitting device according to claim 13, wherein each of said plurality of pixels comprises two semiconductor elements a switching element, a current control element for controlling an amount of current to the light-emitting element, and a capacitor.

18. A light-emitting device according to claim 13, wherein the semiconductor element is an inverted stagger thin film transistor including a microcrystalline semiconductor film.

19. A light-emitting device comprising:
    a display portion comprising a plurality of pixels formed over a substrate; and a driver circuit formed over said substrate, wherein each of said plurality of pixels comprises a plurality of enhancement-type n-channel thin film transistors and a plurality of depletion-type n-channel thin film transistors, wherein all semiconductor elements in said display portion and said driver circuit are n-channel type semiconductor elements, and wherein each of said plurality of pixels comprises a light-emitting element.

20. A light-emitting device according to claim 19, wherein said substrate is a plastic substrate covered with a protective film.

21. A light-emitting device according to claim 19, wherein said light-emitting device is incorporated in one selected from the group consisting of an EL display, an image playback device, a personal computer, a video camera, a digital camera, a mobile computer, a mobile telephone, and an audio.

22. A light-emitting device according to claim 19, wherein a semiconductor element in the display portion has at least two channel forming regions.

23. A light-emitting device according to claim 19, wherein each of said plurality of pixels comprises two semiconductor elements a switching element, a current control element for controlling an amount of current to the light-emitting element, and a capacitor.

24. A light-emitting device according to claim 19, wherein the semiconductor element is an inverted stagger thin film transistor including a microcrystalline semiconductor film.

25. A light-emitting device comprising:

a display portion comprising a plurality of pixels formed over a substrate; and a driver circuit formed over said substrate, wherein each of said pixels comprises an SRAM formed by a plurality of enhancement-type n-channel thin film transistors and a plurality of depletion-type n-channel thin film transistors, wherein all semiconductor elements in said display portion and said driver circuit are n-channel type semiconductor elements, and wherein each of said plurality of pixels comprises a light-emitting element.

26. A light-emitting device according to claim 25, wherein said substrate is a plastic substrate covered with a protective film.

27. A light-emitting device according to claim 25, wherein said light-emitting device is incorporated in one selected from the group consisting of an EL display, an image playback device, a personal computer, a video camera, a digital camera, a mobile computer, a mobile telephone, and an audio.

28. A light-emitting device according to claim 25, wherein a semiconductor element in the display portion has at least two channel forming regions.

29. A light-emitting device according to claim 25, wherein each of said plurality of pixels comprises two semiconductor elements a switching element, a current control element for controlling an amount of current to the light-emitting element, and a capacitor.

30. A light-emitting device according to claim 25, wherein the semiconductor element is an inverted stagger thin film transistor including a microcrystalline semiconductor film.

* * * * *

UNITED STATES PATENT AND TRADEMARK OFFICE
CERTIFICATE OF CORRECTION

PATENT NO. : 7,633,471 B2  Page 1 of 1
APPLICATION NO. : 09/852220
DATED : December 15, 2009
INVENTOR(S) : Yamazaki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 990 days.

Signed and Sealed this

Ninth Day of November, 2010

David J. Kappos
*Director of the United States Patent and Trademark Office*